(12) United States Patent
Engel et al.

(10) Patent No.: US 10,825,911 B1
(45) Date of Patent: Nov. 3, 2020

(54) DICHALCOGENIDE TRANSISTOR

(71) Applicants: Allen Howard Engel, Auburn, WA (US); Evan Thomas Johnson, Kansas City, MO (US)

(72) Inventors: Allen Howard Engel, Auburn, WA (US); Evan Thomas Johnson, Kansas City, MO (US)

(73) Assignee: Allen Howard Engel, Auburn, WA (US)

( * ) Notice: Subject to any disclaimer, the term of this patent is extended or adjusted under 35 U.S.C. 154(b) by 0 days.

(21) Appl. No.: 16/699,983

(22) Filed: Dec. 2, 2019

(51) Int. Cl.
| | |
|---|---|
| H01L 29/49 | (2006.01) |
| H01L 29/786 | (2006.01) |
| C23C 16/30 | (2006.01) |
| H01L 29/40 | (2006.01) |
| H01L 29/24 | (2006.01) |

(52) U.S. Cl.
CPC ........ *H01L 29/4966* (2013.01); *C23C 16/305* (2013.01); *H01L 29/24* (2013.01); *H01L 29/401* (2013.01); *H01L 29/786* (2013.01)

(58) Field of Classification Search
CPC ... C23C 16/305; H01L 29/4966; H01L 29/24; H01L 29/401; H01L 29/786; H01L 21/02417; H01L 21/02485; G03C 2001/095; G01C 2009/0185
See application file for complete search history.

(56) References Cited

U.S. PATENT DOCUMENTS

| | | |
|---|---|---|
| 2,826,542 A | 11/1958 | Shyne et al. |
| 3,979,544 A | 9/1976 | Kolbe et al. |
| 4,073,980 A | 2/1978 | Westdale et al. |
| 4,167,411 A | 9/1979 | Westdale et al. |
| 4,248,950 A | 2/1981 | Westdale et al. |
| 4,395,485 A | 7/1983 | Kashiwagi et al. |
| 4,892,798 A | 1/1990 | Lammanna et al. |
| 5,037,516 A | 8/1991 | Buck |
| 5,279,720 A | 1/1994 | Divigalpitiya |
| 5,347,301 A | 9/1994 | Kawanishi |
| 5,504,559 A | 4/1996 | Ojima et al. |
| 5,512,406 A | 4/1996 | Takeda et al. |
| 6,190,634 B1 | 2/2001 | Lieber et al. |
| 6,511,701 B1 | 1/2003 | Divigalpitiya et al. |
| 8,066,967 B2 | 11/2011 | Eberlein et al. |

(Continued)

OTHER PUBLICATIONS

Song et al., Synthesis and properties of molybdenum disulphide: from bulk to atomic layers, RSC Adv., 2015. 5. 7495, pp. 7496-75142 (Year: 2015)*

(Continued)

*Primary Examiner* — Galina G Yushina

(57) ABSTRACT

A transistor comprising a substrate, a gate electrode, a gate layer, a source electrode, a drain electrode, and semiconducting particles. The gate layer includes a dielectric material. A portion of the gate layer is sandwiched within the gap between the source electrode and the drain electrode. The gate layer also includes a plurality of semiconducting particles, and these semiconducting particles bridge the gap between the source electrode and the drain electrode. The major axis of each semiconducting particle is oriented in a direction normal to the device. In some embodiments, the particles are flake shaped. In some embodiments, the particles are dichalcogenide chemicals.

18 Claims, 9 Drawing Sheets

(56) References Cited

U.S. PATENT DOCUMENTS

| | | | | |
|---|---|---|---|---|
| 8,203,138 | B2* | 6/2012 | Takeya | H01L 51/052 257/40 |
| 2013/0041235 | A1* | 2/2013 | Rogers | A61B 5/1107 600/306 |
| 2014/0238480 | A1* | 8/2014 | MacDonald | H01G 9/2022 136/256 |
| 2014/0353166 | A1* | 12/2014 | Iezzi | B01J 37/0238 205/638 |
| 2015/0146761 | A1* | 5/2015 | Caraveo Frescas | H01L 29/24 374/178 |

OTHER PUBLICATIONS

Zhang et al. 2D crystals of transition metal dichalcogenide and their iontornic functionalities, 2D Mater. 2 (2015) 044004, pp. 1-19 (Year: 2015).*

Pu et al. Highly Flexible MoS2 Thin-Film Transistors with Ion Gel Dielectrics, Nano Letters, 2012, pp. 4013-4017 (Year: 2012).*

Gomes et al. High mobility solution processed MoS2 thin film transistors, Solid State Electronics 158 (2019), pp. 75-84 (Year: 2019).*

Wang et al. Ionic Liquid Gating of Suspended MoS2 Field Effect Transistor Devices, Nano Letters, 2015, 15, pp. 5284-5288 (Year: 2015).*

Coleman, J. N., Two Dimensional Nanosheets produced by liquid exfoliation of layered materials, journal article, Feb. 4, 2011, pp. 568-571., vol. 332, Issue. 6017, Science, USA.

Guo, Y., Intrinsic Anion Vacancies in Monolayer Transition Metal Dichalcogenides, journal article, Feb. 4, 2011, pp. 568-571, vol. 332, Issue. 6017, Science, USA.

Desai, S. B., MoS2 transistor with 1nm gate length, journal article, Oct. 7, 2016, pp. 99-102, vol. 354, Issue. 6308, Science, USA.

Xu, G., Metallic and ferromagnetic MoS2 nano-belts with vertically aligned edges, journal article, Sep. 2015, pp. 2946-2953, vol. 8, Issue. 9, Nano Research, USA.

Pu, J., Highly Flexible MoS2 Thin-Film Transistors with Ion Gel Dielectrics, journal article, Jul. 16, 2012, pp. 4013-4017, vol. 12, Issue. 8, Nano Letters, USA.

Pu, J., Fabrication of stretchable MoS2 thin-film transistors using elastic ion-gel gate dielectrics, Jul. 8, 2013, pp. 4013-4017, vol. 103, Issue. 2, Applied Physics Letters, USA.

Tongay, S., Magnetic properties of MoS2: Existence of Ferromagnetism, journal article, Sep. 2012, pages, vol. 101, Issue. 12, Applied Physics Letters, USA.

Li, H., Investigation of MoS2 and Graphene Nano-sheets by Magnetic Force Microscopy, journal article, Feb. 26, 2013, pp. 2842-2849, vol. 7, Issue. 3, ACS Nano, USA.

Mak, K. F., Atomically thin MoS2: A new direct-gap semiconductor, journal article, Sep. 2010, pp. 136805, vol. 105, Issue. 13, Physical Review Letters, USA.

Han, T., Probing the Optical Properties of MoS2 on SiO2/Si and Sapphire Substrates, journal article, May 2019, pp. 740, vol. 9, Issue. 5, Nanomaterials, USA.

* cited by examiner 102   101   103   104   105  106

DICHALCOGENIDE TRANSISTOR

BACKGROUND

Since the discovery of Graphene, scientists worldwide have discovered many new uses for (so called) 2 dimensional materials. Scientists have made prototypes of 2 dimensional ("2D") rectifiers with high switching speeds, 2D transistors with miniscule dark currents, 2D abrasion resistant coatings, simple 2D bhj solar cells, 2D phototransistors, 2D hydrogen evolution reaction devices, and more.

In general scientists have made these prototypes one monolayer dichalcogenide flake at a time, using demanding, expensive, and time consuming processes. The processes that the scientists teach are generally not suitable for low cost mass production.

It would be an advance in the art if 2D devices could be mass produced using low cost printing processes.

SUMMARY

Semiconductive particles are deposed bridging the gate layer of the transistor. In some embodiments the semiconductive particles are deposed with an orientation normal to the device. In other embodiments, the semiconductive particles are deposed oriented at various angles to the device, from 20 degree angles to about 90 degrees.

DETAILED DESCRIPTION

Figure 1:
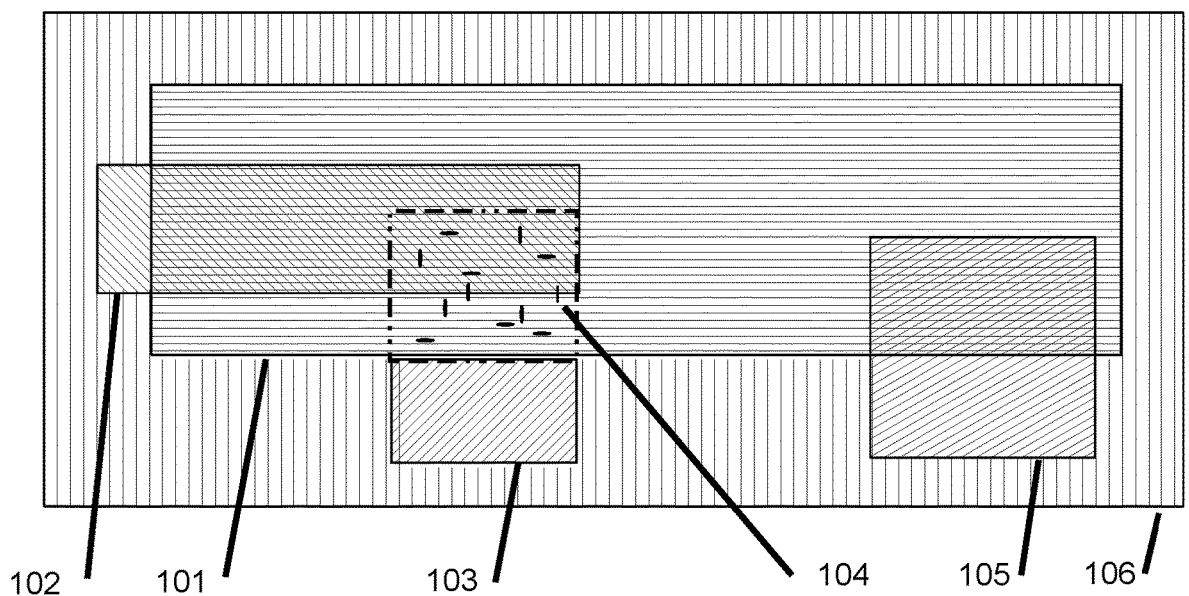
FIG. 1. describes a transistor.

In FIG. 1, the layer 101 has semiconductive particles 104 that have been buried into the layer 101 to bridge the thickness of the layer 101, and oriented normal to the layer 101. The source electrode 103 is in conformal contact with the layer 101 and the semiconductive particles 104. The drain electrode 102 is in conformal contact with the layer 101 and the semiconductive particles 104. The gate electrode 105 is located on top of and in conformal contact with the layer 101. The gate electrode 105 modulates the charge transfer from the source electrode 103 to the drain electrode 102 by populating the layer 101 with holes. When the layer 101 has an excess of holes, this allows the device to function in an on state and enables the current between the source electrode 103 and the drain electrode 102. Gate layer 101, drain electrode 102, source electrode 103, semiconductive particles 104, and gate electrode 105 are partly deposed on to substrate 106.

Figure 2:
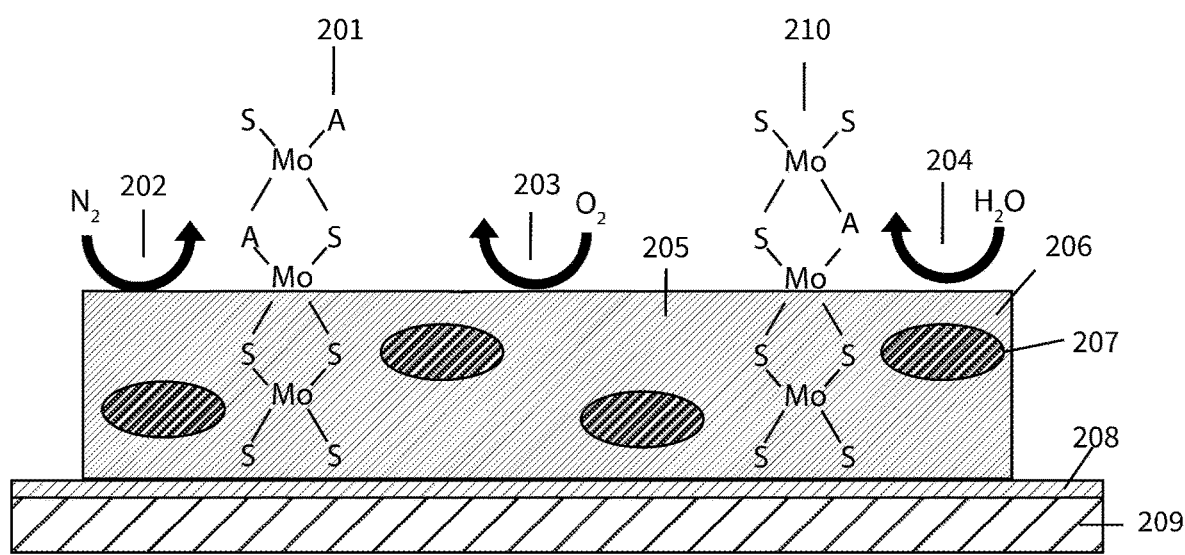
FIG. 2 describes the functioning of the Polymer Barrier.

Referring to sideview FIG. 2, one embodiment is described in relation to the barrier characteristics of the curing polymer barrier 205. The Electrode 208 is deposed on to the Substrate 209. The Ionic liquid gel 207 is contained within Polymer Barrier 205, and the dispersion morphologies of the Polymer Barrier 205 are dependent on the concentration of Ionic Liquid 207. The Ionic Liquid 207 aids in the device charge transfer characteristics. Polymer Barrier 205 prevents contaminants like $N_2$ 202, $O_2$ 203, and $H_2O$ 204, and other contaminants from affecting the submerged portion of the Semiconductive Particles 210. Only the portions of Semiconductive Particles 210 which protrude from the surface of Polymer Barrier 205 can be implanted with Dopant 201.

Figure 3:
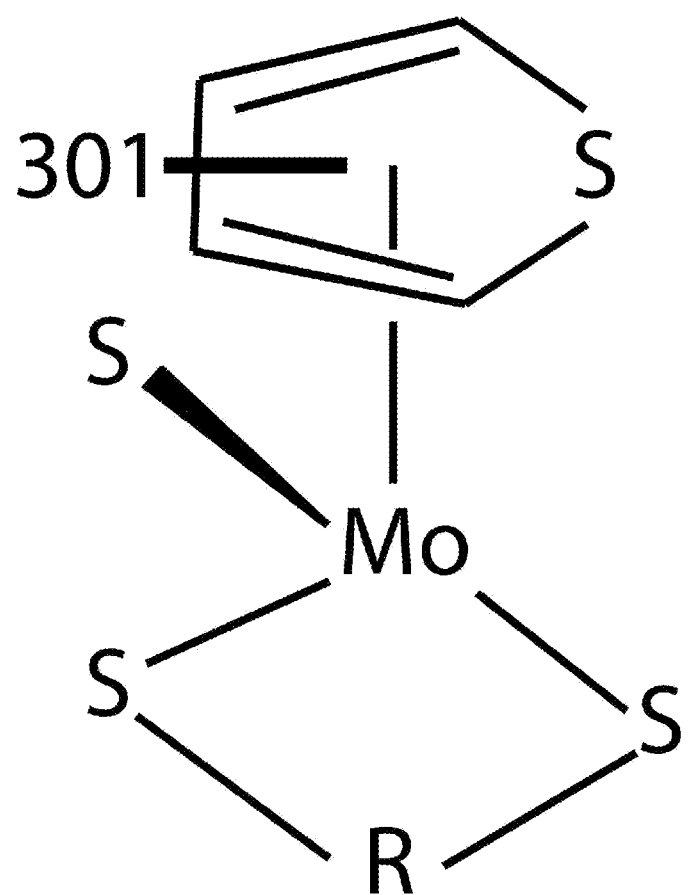
FIG. 3 describes $MoS_2$ orbital overlap with a thiophene containing molecule creates dative bond FIG. 4. describes a thin film transistor.

Referring to FIG. 3 describes the orbital interaction between MoS2 and a thiophene molecule. The orthogonal p electrons from the pi bonds in the thiophene ring donate electron density to the Mo metal. This type of interaction is known as a dative or coordinate covalent bond. The thiophene acts as a 6 pi electron donor ligand.

Figure 4:
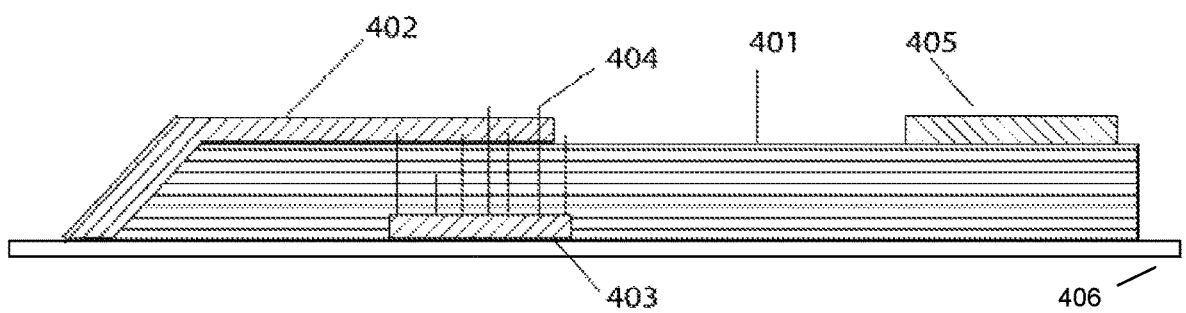

Sideview FIG. 4 describes a thin film transistor. The thin dimension layer 401 has semiconductive particles 404 that have been buried into the thin dimension layer 401 to bridge the thickness of the layer 401, and oriented normal to the layer 401. The thin dimension source electrode 403 is in conformal contact with the layer 401 and the semiconductive particles 404. The thin dimension drain electrode 402 is in conformal contact with the layer 401 and the semiconductive particles 404. The thin dimension gate electrode 405 is located on top of and in conformal contact with the layer 401. The gate electrode 405 modulates the charge transfer from the source electrode 403 to the drain electrode 402 by populating the layer 401 with holes. When the layer 401 has an excess of holes, this allows the device to function in an on state and enables the current between the source electrode 403 and the drain electrode 402. Gate layer 401, drain electrode 402, source electrode 403, semiconductive particles 404, and gate electrode 405 are partly deposed on to substrate 406.

Figure 5:
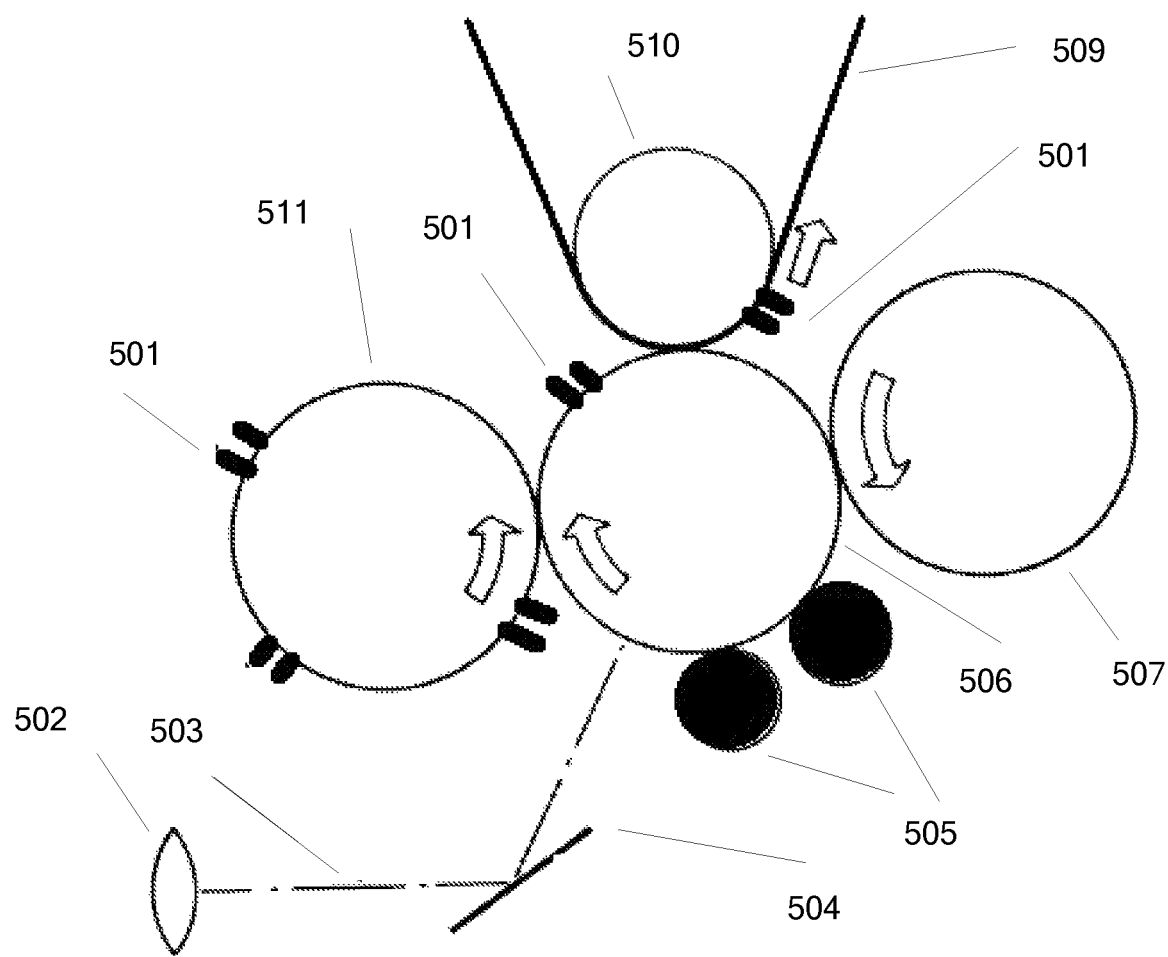
FIG. 5. describes an assembly which deposits Semiconducting Particles normal to a coated substrate.

In Side View FIG. 5, Developer Drum 511, Photoconductor Cylinder 506, Impression Roller 510, Cleaning Roller 507, and Charging Rollers 505 are rotating, and all of these are proximal to each other. Cleaning Roller 507 and Photoconductor Cylinder 506 have surfaces in direct contact with each other. Charging Rollers 505 and Photoconductor Cylinder 506 have surfaces in direct contact with each other. Coated Substrate 509 is in contact with Impression Roller 510 and Photoconductor Cylinder 506, forming a nip between the surfaces of Impression Roller 510 and Photoconductor Cylinder 506.

As all these rotate or move, Semiconductive Particles 501 contact the Developer Drum 511. The major axis of the Semiconductive Particles 501 is normal to the developer drum 511. Radiation Line of Exposure 503 is handled by the Lens 502, and is directed to the Photoconductor Cylinder 506. Charging Rolls 505 charge the Photoconductor Cylinder 506 with an electrical charge. Where the Radiation Line of Exposure 503 strikes the Photoconductor Cylinder 506, the electrical charge is removed from the irradiated portion of the surface of the Photoconductor Cylinder 506. Semiconductive Particles 501 are attracted to the charged portions of the surface of Photoconductor Cylinder 506 and transit away from Developer Drum 511. As the Semiconductive Particles 501 transit to Photoconductor Cylinder 506, the Semiconductive Particles 501 are oriented with their major axis normal to Photoconductor Cylinder 506. Coated Substrate 509 moves and enters the nip formed between turning Impression Roller 510 and Photoconductor Cylinder 506. As the Coated Substrate 509 surface nears the Photoconductor Cylinder 506, the Semiconductive Particles 501 are attracted to the stronger electrical charge of the Conductive Substrate 509, and transit to Coated Substrate 509, with their major axis oriented normal to the Coated Substrate 509 surface. As Cleaning Roller 507 contacts Photoconductor Cylinder 501, Cleaning Roller 507 removes the excess Semiconductive Particles 501 from the Photoconductor Cylinder 506.

Figure 6:
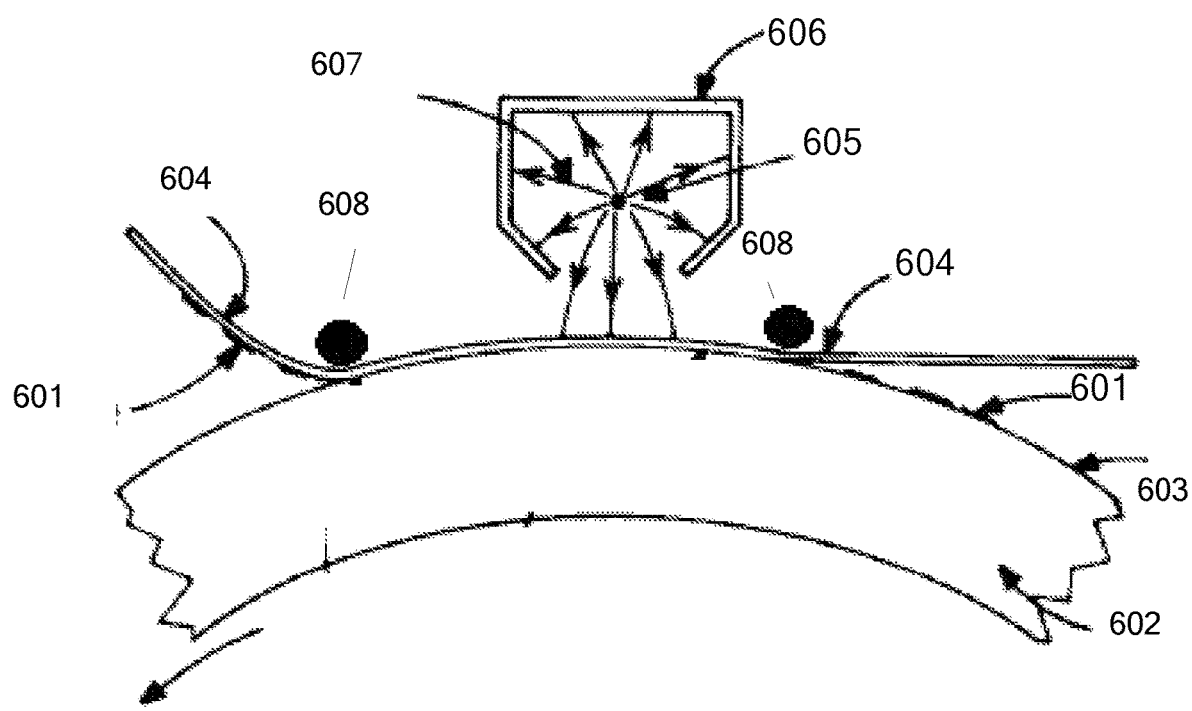
FIG. 6. describes how a Corona Generating Unit deposes Semiconductor Particles normal to a Coated Substrate.

In sideview FIG. 6, Semiconductive Particles 601 have been previously patterned applied to portions of Photoconductor Layer 603, with the major axis of Semiconductive Particles 601 oriented normal to the Photoconductor Layer 603. As the Xerographic Drum 602 and its Photoconductor Layer 603 surface and Roller 608 rotate, the Coated Substrate 604 enters the nip formed by the Photoconductor Layer 603 surface of Xerographic Drum 602 and Roller 608. Then the Coated Substrate 604 is handled in close proximity to the patterned Semiconductive Particles 601 within the nip formed by the Photoconductor Layer 603 of Xerographic Drum 602 and Roller 608. While the Xerograhic Drum 602 and the Coated Substrate 604 continuously move, a Corona Wire 605 contained within the Corona Generating Unit 606 generates a Flow of Ions 607. The Flow of Ions 607 electrically charge the Coated Substrate 604, causing the patterned Semiconductive Particles 601 to transfer from the Photoconductor Layer 603 of Xerographic Drum 602 to the Coated Substrate 604. As the Semiconductive Particles 601 transit, the orientation of their major axes are normal to the Coated Substrate 604. In some embodiments, the Coated Substrate 604 then passes through a second nip formed by a Roller 608 and the Xerographic Drum 602.

Figure 7:
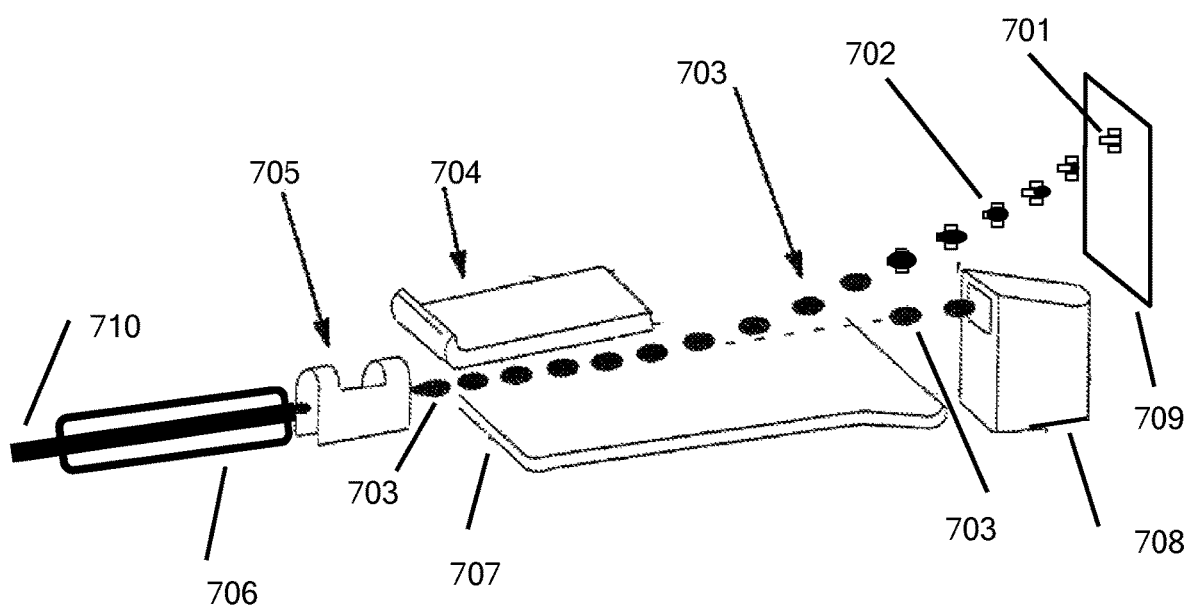
FIG. 7. describes how the transiting of Semiconductive Particles and carrier fluid are influenced by an electrical field, and how the carrier liquid evaporates from the Semiconductive Particles during transit, and how the Semiconductive Particles are deposed to a Coated Substrate.

In FIG. 7, the Liquid Drops. 703 continues and its transiting is influenced by the electrical field generated by Top Deflection Plate 704 and Bottom Deflection Plate 707. Sometimes the electrical field generated by Top Deflection Plate 704 and Bottom Deflection Plate 707 causes the Liquid Drops. 703 to transit to the Return Orifice 708. Sometimes the electrical fields generated by Top Deflection Plate 704 and Bottom Deflection Plate 707 causes the Liquid Drops. 703 to transit to the Coated Substrate 709. In this case, as the Liquid Drops. 703 transits to the Coated Substrate 709, the carrier liquid portion of the Liquid Drops 703. evaporates, and the Liquid Drops. 703 change to Semiconductive Particles mixed with a small amount of carrier liquid 702, and then the Semiconductive Particles mixed with a small amount of carrier liquid 702 change further to become Semiconductive Particles lacking carrier liquid a 701, which ultimately depose to the Coated Substrate 709.

Figure 8:
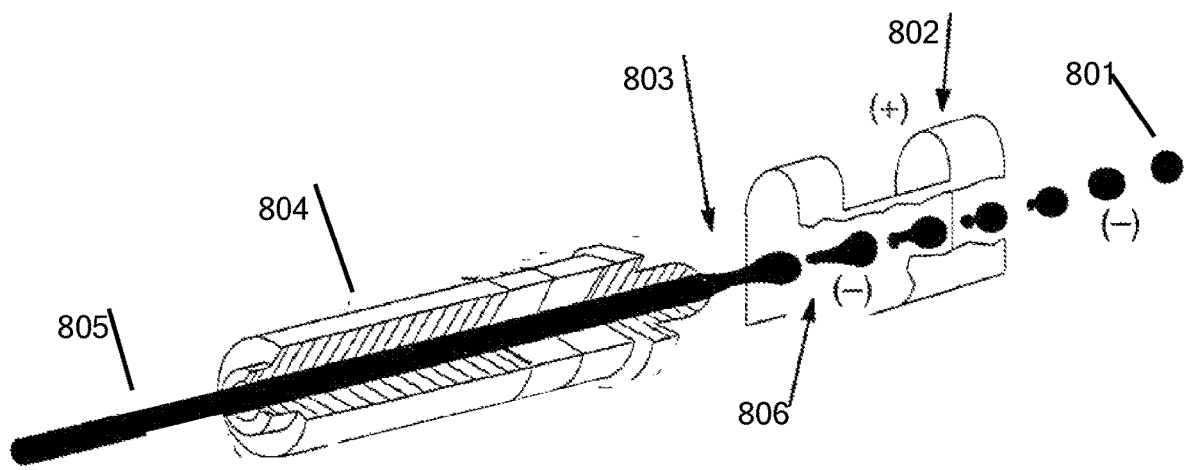
FIG. 8. describes how a Continuous liquid stream containing Semiconductive Particles is oscillated, and the liquid stream separates into separate drops, and an electrical charge is applied to the separate drops.

In FIG. 8, a Continuous Stream. 805 enters the Drop Emitter 804. The Drop Emitter 804 vibrates the Continuous Stream. 805, causing the Continuous Stream. 805 to oscillate. The Continuous Stream. 805 exits the Drop Emitter 804, and Plateau-Rayleigh instability 803 causes the Continuous Stream. 805 to separate into Separate Drops. 801. The Separate Drops. 801 pass through an electrical field emitted by Charge Tunnel 802. The electrical field emitted by Charge Tunnel 802 induces an electrical charge to Separate Drops. 801.

Figure 9:
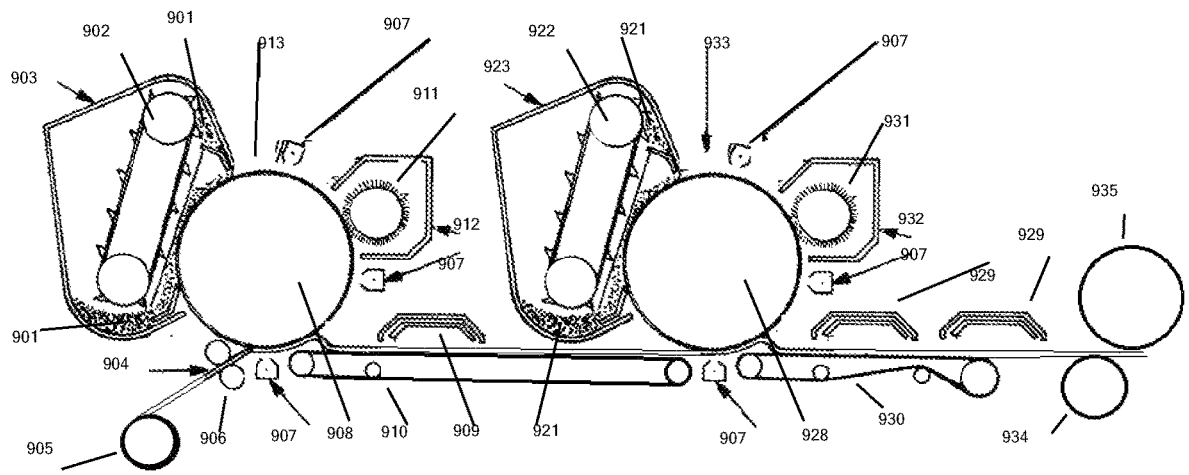
In FIG. 9. an assembly is described which first deposes a thermoplastic powder on to a continuous substrate, and secondly deposes Semiconductive Particles into the thermoplastic powder coating.

In sideview FIG. 9, Thermoplastic powder 901 and Thermoplastic powder distribution assembly 902 are contained within the Housing 903. Thermoplastic powder 901 is handled by the Thermoplastic powder distribution assembly 902. Corona assembly 907 induces an electrical charge on the Drum 908. Optional radiation 913 dissipates the electrical charge on portions of the Drum 908. Thermoplastic powder 901 is attracted to the portions of Drum 908 not affected by Radiation 913. Substrate web 904 is unwound from the Unwind Roll 905. The Drum 908 rotates and handles the Thermoplastic powder 901 to close proximity to the Substrate 904. Pressure rolls 906 maintain the close proximity of the Substrate 904 to the Drum 908. Corona assembly 907 modifies the charge on the Drum 908 and Substrate 904, causing the Thermoplastic powder 901 to depart from the Drum 908 and transit towards the Substrate 904 and become deposed upon the Substrate 904. The Substrate 904 is further handled by the Conveyor 910. The Substrate 904 moves and continues under the Heating Element 909, and the Thermoplastic powder 901 changes state from a powder to a continuous soft durometer low viscosity coating. Meanwhile Brushing Roller 911, Housed in Housing for Brushing Roller and Excess Powder 912, removes the excess Thermoplastic powder 901 from the Drum 908.

Further Semiconductive Particles 921 and the Semiconductive Particle distribution assembly 922 are contained within the Housing 923. Semiconductive Particles 921 are handled by the Semiconductive Particles distribution assembly 922. Corona assembly 907 induces an electrical charge on the Drum 928. Optional radiation 933 dissipates the electrical charge on portions of the Drum 928. Semiconductive Particles 921 are attracted to the portions of Drum 928 not affected by Radiation 933. The Drum 928 rotates and handles the Semiconductive Particles 921 to close proximity to the Substrate 904. Conveyor 910 and Conveyor 930 maintain the close proximity of the Substrate 904 to the Drum 928. Corona assembly 907 modifies the charge on the Drum 928 and Substrate 904, causing the Semiconductive Particles 921 to depart from Drum 928 and transit towards the now soft durometer low viscosity Thermoplastic powder 901, and the transiting Semiconductive Particles 921 become partly buried within the Thermoplastic powder 901 deposed upon the Substrate 904. The Semiconductive Particles 921 are oriented normal to the Substrate 904. The Substrate 904 is further handled by the Conveyor 930. The Substrate 904 moves and continues under the Heating Element 929. The Conveyor 930 further handles the Substrate 904 to contact to the Chill Roller 934. Then the Substrate 904 is rewound around the Rewind Roller 935. Meanwhile Brushing Roller 931, housed in the Housing for Brushing Roller and Semiconductive Particles 932, removes the excess Semiconductive Particles 921 from the Drum 928.

Molybdenum Disulfide Characteristics and Dichalcogenides

Two-Dimensional Dichalcogenides Exhibit Distinctive Properties from their 3-d counterparts and it is for this reason they have attracted huge interest over the past decade. The fact that, at submicron scales, 2 d materials exhibit different behavior as compared to their 3 d form can be of great advantage.

Transitional metal dichalcogenides, sometimes called tmd's or tmdc, in monolayer form are structurally stable, have bandgaps of approximately 1 ev-3 ev and exhibit electron mobilities comparable to those of silicon. Therefore they are excellent for fabrication of diodes, transistors, solar cells, and other devices. $Mos_2$ has a direct bandgap of 1.8 ev in monolayer form and thus makes it applicable for switching and optoelectronic devices. Few and many layered $MoS_2$ also have novel bandgaps, however with increasing layers the band gap decreases.

Bulk $MoS_2$ is a diamagnetic, indirect bandgap semiconductor, with a bandgap of 1.23 eV. All forms of $MoS_2$ have a layered structure, in which a plane of molybdenum atoms is sandwiched by planes of sulfide ions. These three strata form a monolayer triad of MoS2. Bulk $MoS_2$ consists of stacked triads, which are held together by weak Van der Waals interactions.

Crystalline $MoS_2$ naturally occurs in two phases, $2H-MoS_2$ and $3R-MoS_2$, where the "H" and the "R" indicate hexagonal and rhombohedral geometry, respectively. In these structures each molybdenum atom exists at the center of a trigonal prismatic coordination sphere and is covalently bound to six sulfide ions. Each sulfur atom has pyramidal coordination and is bound to three molybdenum atoms. Both the 2H- and 3R-phases are semiconducting phases of $MoS_2$.

The 1T form of $MoS_2$ is trigonal in its geometry. In this phase, $MoS_2$ exhibits metallic properties. The metallic phase has $\cong 10^5$ siemens (or higher) electrical conductivity compared to the semiconducting phase. The 1T phase has superior electron transfer capability. Using 1T MoS2 as an electrode will minimize or even eliminate the addition of any further conductive additives and simultaneously achieves an excellent rate performance for energy storage fields. MoS2 is catalytically inert for hydrogen evolution reaction (HER), whereas the basal planes of metallic 1T MoS2 are rich in active sites,[33,34] which has the benefit of higher reaction kinetics between electrons and protons (H+) on the active sites, and makes the 1T MoS2 a promising candidate for energy generation and conversion.

The MoS2 flake has few or no dangling bonds. Along the thin edge of the flake, some of the Molybdenum atoms have valence domains which are available to form associations.

A typical $MoS_2$ monolayer is less than 7 Å thick and the Van der Waals forces between the interlayers are very weak. Therefore, individual layers can be isolated using traditional mechanical cleavage techniques, such as chemical exfoliation, ball milling, and intercalation, amongst many other exfoliation techniques.

In [9], a systematic study of $MoS_2$ was performed to analyze the function of thickness (layers). With decreasing thickness, there was progressive confinement-induced shift in the indirect band gap from the bulk value of 1.29 eV to 1.90 eV. The $MoS_2$ crystals were observed to undergo a crossover from an indirect bandgap semiconductor to direct bandgap semiconductor when in the monolayer form. With monolayer MoS2 there was an significant increase in photoluminescence (PL) Quantum yield (QY) of up to 1000 times as strong when compared to the bulk crystal. The PL QY observed for bulk $MoS_2$ samples was seen to be negligible whereas PL was observed for few-layer $MoS_2$ samples and for the monolayer $MoS_2$, the PL observed was the brightest.

$MoS_2$ is relatively unreactive and has a low coefficient of friction. Weak interlayer Van der Walls interaction present between TMDCs facilitates the exfoliation of bulk crystal into few layer or monolayer crystals or flakes, which exhibit layer dependent properties. In addition, monolayer MoS2 has a high electron mobility and high luminous efficiency, allowing high efficiency in photovoltaic fields, such as in field effect transistors and sensors [10].

Another important property of TMDC monolayers is their high exciton binding energy (~0.5-1 eV) arising from substantially reduced dielectric screening relative to the bulk. This promotes strong and long-lived excitons, making them suitable for LEDs, photo-markers, etc. Despite being atomically thin, the surfaces of $MoS_2$ 2D materials are self-passivated without any dangling bonds. The monolayer $MoS_2$ is a crystalline structure, whereby the upper and lower layers are planes composed of sulfur atoms, and the middle is a layer of metal molybdenum atoms. Each molybdenum atom in the layer covalently bonds with six sulfur atoms to form the Mitsubishi columnar coordination structure. Meanwhile, each sulfur atom combines with three molybdenum atoms through covalent bonding.

$MoS_2$ is a layered semiconductor material with strong light absorption, so it can be applied to photoluminescence, photovoltaic, and photo-catalytic research. Since the surface-to-volume ratio of quasi-two-dimensional materials is extremely high, understanding their surface characteristics is also crucial for practically controlling their intrinsic properties and fabricating semiconductors, transistors, and diodes with p-type characteristics and n-type characteristics. The surface electron concentration of $MoS_2$ is nearly four orders of magnitude higher than that of its inner bulk. Van der Waals crystals without dangling bonds, such as $MoS_2$, are expected to have an inert surface and fewer surface states [12]. The structure of the layered metal dichalcogenides includes one hexagonal packed sheet of metal atoms Sandwiched between two hexagonal sheets of chalcogen atoms. The coordination of the metal atoms by the chalcogen atoms is either hexagonal (e.g. titanium disulfide and Vanadium disulfide) or trigonal prismatic (e.g. molybdenum disulfide and niobium disulfide). The MX layers are kept together by Van der Waals forces and Several Stacking polytypes exist. The weak bonding between layers, where a layer consists of a monolayer of metal atoms clad together by covalently bonded chalcogens, leads to extremely aniso The coordination and the oxidation state of the metal atom determine the electronic properties of the material. For example, the group V metal atoms (niobium and tantalum) are in a trigonal prismatic coordination and the corresponding dichalcogenide materials are metals, while group VI atoms (molybdenum and tungsten) are also in a trigonal prismatic coordination but have a full dz band and hence are semiconductors. Molybdenum disulfide has both a hexagonal and a trigonal prismatic coordination and can thus be either metallic or Semiconducting respectively.

The average major axis length and the average thickness of the dichalcogenide flake shape are preferably from 0.5 microns to 25 microns and from 2 nanometer to 100 nanometers, respectively. The major axis of the dichalcogenide flake shape refers to the longest portion of the dichalcogenide flake shape when being observed from the thickness direction thereof.

Dichalcogenide Transistor Characteristics

In some embodiments, the transistor is comprised of these components: a common substrate, a gate electrode, a gate layer, a source electrode, a drain electrode, a channel formed by the gap between the source electrode and the drain electrode, said channel filled with both a portion of the gate layer and a plurality of dichalcogenide flakes which bridge the gap between the source electrode and the drain electrode. The dichalcogenide flakes bridging the gap contacted the source electrode and the dichalcogenide flakes simultaneously contacted the drain electrode. In these embodiments, the source electrode and the drain electrode sandwich a portion of the gate layer, and the height of the gap between these electrodes is the channel length.

In some transistor embodiments, the electrodes are comprised of PEDOT/PSST coating, which has a low durometer, and the much harder dichalcogenide flake can easily embed into the coating. Likewise, a PEDOT/PSST coating can form a conformal cap on the top of the flake, or surround the flake to achieve a good electrical contact. PEDOT/PSST is an informal name for poly(3,4-ethylenedioxythiophene) polystyrene sulfonate.

In some embodiments the metallic component of the chalcogenide is titanium, Zirconium, hafnium, Vanadium, tantalum, niobium, molybdenum, tungsten, or tin. Or gallium, or indium, or thallium. Or two-dimensional semiconductor includes at least one of a transition metal dichalcogenide, a CdTe single-layer, Gas, GaSe, GaS1-Sez, CdI2, PbI2, K2A14 (Si A12023) (OH, F)4, PbI2, K2A14 (Si A12023)(OH, F)4, Molybdenum disulfide (MoS2), molybdenum diselenide (MoSex), molybdenum ditelluride (MoTex), tungsten disulfide (WS), tungsten diselenide (WSez), tungsten ditelluride (WTe), niobium disulfide (NbS), niobium diselenide (NbSez), niobium ditelluride (NbTex), tantalum disulfide (TaS_), tantalum diselenide (TaSe), tantalum ditelluride (TaTe), hafnium disulfide (HfS), hafnium diselenide (HfSez), hafnium ditelluride (HfTez), titanium disulfide (TiS), titanium diselenide (TiSex), and titanium ditelluride.

The layered metal chalcogenides include any compounds comprising metal atoms and chalcogen atoms in a layer-type structure. Examples include layered metal dichalcogenides and layered metal monochalcogenides. The layered metal dichalcogenides have the chemical formula MX wherein M represents a metal and X represents a chalcogen (i.e. sulfur, selenium or tellurium). The structure of the layered metal dichalcogenides preferably includes one sheet of metal atoms sandwiched between two sheets of chalcogen atoms. In the layered metal dichalcogenides, the metallic component M is preferably selected from transition metals Such as titanium, zirconium, hafnium, vanadium, tantalum, niobium, molybdenum and tungsten and non-transition metals such as tin. More preferred are niobium, molybdenum, tantalum, tin and tungsten, and most preferred are niobium, molybdenum and tantalum. More preferred chalcogens are sulfur, selenium and tellurium, and most preferred are sulfur and selenium. Metals that form monochalcogenides which may be suitable include gallium, indium and thallium The structure of the metal chalcogenides comprises sheets of metal atoms sandwiched between sheets of chalcogen atoms. In the layered metal dichalcogenides, for example, the metallic sheet is covalently bonded to the two adjacent sheets of chalcogens. Two adjacent MX layers are kept together by van der Waals forces. This structure leads to extremely anisotropic mechanical, chemical and electrical properties. Exposed surfaces of these materials have no dangling bonds and, hence, are chemically inert. This makes them particularly suitable for use as hole transport layers in FETs as it removes the problem of chemical reactions at the interfaces with the organic semiconducting layer which would otherwise reduce the efficiency and effective lifetime of the FETs.

Chalcogenides are particularly of great interest to researchers worldwide due to their functionality and varied responses to optical, electrical and thermal stimuli. Besides, they also can switch, bend, self-organize and photo darken and have inherent infrared transparency, optical non-linearity, and semiconducting nature.

One of the major aims in the electronics industry is to fabricate transistors and transistor substrates that can bend and stretch and be used for wearable and foldable devices. Besides, some predict that scaling of silicon transistors will fail below 5 nanometers gate lengths because of severe short channel effects.

So, layered semiconductor like $MoS_2$ are of great potential due their attractive properties such as reduced short channel effects, atomically uniform thickness, and larger bandgaps. In [3] the authors have demonstrated $MoS_2$ transistor with Inm physical gate length, no short channel effects, and their device exhibited excellent switching characteristics. Many $MoS_2$ based transistors have been reported to exhibit a very high on/off ratio and good electron mobility and are flexible.

In some embodiments, the substrate is flexible, and the all the ingredients deposed on the substrate are themselves flexible, making a flexible device.

Bertolazzi et al. teaches "We find that the in-plane stiffness of monolayer MoS2 is 180±60 Nm−1, corresponding to an effective Young's modulus of 270±100 GPa, which is comparable to that of steel. Breaking occurs at an effective strain between 6 and 11% with the average breaking strength of 15±3 Nm−1 (23 GPa). The strength of strongest monolayer membranes is 11% of its Young's modulus, corresponding to the upper theoretical limit which indicates that the material can be highly crystalline and almost defect-free. Our results show that monolayer MoS2 could be suitable for a variety of applications such as reinforcing elements in composites and for fabrication of flexible electronic devices. "[49]

Pu et al. teaches "fabricated using ion gel as a gate dielectric on a PI substrate, and drain current-gate voltage curves of the MoS2 EDLT for 0.75 mm bending radius, and the dependence of the drain current and carrier mobility on bending radius. The ion gel films showed a capacitance of 4.67 F/cm2 on the PI substrate at 1 Hz. The mobility of MoS2 EDLT on the flexible PI substrates was 3.01 cm2/(V s) between Vg of (1.1 and 1.5) V with current Ion/Ioff ratio of 103. The mobility of MoS2 EDLT was 12.5 cm2/(V s) between the Vg of (1.5 and 2.0) V. MoS2 EDLTs fabricated on flexible PI showed excellent mechanical flexibility on bending, because no degradation was noticed for a curvature radius of 0.75 mm. The mechanical flexibility of MoS2 EDLTs was found to be better, compared with FETs based on graphene and CNTs." [50] EDLT is an informal name for electric double layer transistor.

Yoon et al. prepared flexible and optically transparent MoS2 FETs using exfoliated MoS2 film.[51][53]

The GF of MoS2 FET was found when the device was switched off (Vbg<10 V), and reached as high as 40 at Vbg=20 V subthreshold regime, and then decreased again close to Vb g>20 V, due to the combined effect of the strain-induced bandgap and the evolution of Fermi level with change in Vbg. The mechanical stability of flexible MoS2 FETs on the Al2O3/ITO/PET substrate was examined under different bending radius and 20, 60, and 80 bending cycles, where the effect of bending on the FET device was found to be negligible. MoS2 FETs showed good mechanical stability, even after 180 bending cycles recorded over several days. [51][54]

MoS2 Exfoliation Processes

A complete description of processing of monolayer MoS2 has been discussed in [41], which is summarized below:

Mechanical Exfoliation

This method, also known as the 'Scotch-tape method', was first used to isolate layers of graphene[42]. Applying a sticky tape to a bulk crystal sample and then peeling it off will result in thin layers of crystal sticking to the tape. This is due to greater mutual adhesion than the interlayer adhesion. This sticking-and-peeling process can be repeated until single monolayers are produced. These can then be transferred onto a substrate (e.g. by a PDMS stamp). While this process has a low monolayer yield, it produces high-quality crystalline monolayers that can be >10's microns in size. Despite being 'low-tech', it is still a preferred processing method for TMDC research.

Solvent Exfoliation

In [43,44], the authors described how bulk crystals can be sonicated in an organic solvent breaking them down into thin layers. A distribution in the size and thickness of the layers is obtained, with a surfactant often added to stop the layers restacking.

Intercalation

Intercalation of MoS2 was first demonstrated in 1986 [45]. Bulk crystals are placed in a solution which acts as a source of lithium ions (commonly n-butyllithium dissolved in hexane), which diffuse between the layers of the crystal. After this, water is added which then interacts with the lithium ions to produce hydrogen, pushing the layers apart. This method requires careful control over the experimental parameters in order to obtain a high monolayer yield. The resulting layers also tend to have the less desirable metallic 1T structure rather than the semiconducting 2H structure. The 1T structure can however be converted to the 2H through thermal annealing.

Vapor Deposition

Chemical vapor deposition involves a chemical reaction to convert a precursor to the final MoS2. Commonly, MoO3 is annealed at high temperature (~1000° C.) in the presence of Sulphur to produce MoS2 films.

A promising alternative route to MoS2 monolayer growth is through physical vapour deposition, where MoS2 powder is used directly as the source. This can yield high-quality monolayer flakes (up to 25 microns in size) which display optical properties commensurate with exfoliated layers [46].

After exfoliation, the mos2 triads have a flake shape, with a edge thickness measuring from 0.5 nanometers to 100 nanometers. The length and width of the flakes measure in nanometers to micrometers in size.

Electrostatic Deposition and Other Printing Processes

These electrical deposition methods share many of these individual process steps to deposit the dichalcogenide flakes:

A conductive charged electrode induces a charge to a plurality of dichalcogenide flakes due to ohmic contact with the conductive charged electrode. A dielectric gate layer is interposed between a charged substrate and the electrode, the gate layer coated on to the charged substrate. Then subjecting at least a portion of the electrically charged and induction charged flakes to an electrical field between the electrode and the conductive substrate, gate layer; and causing the at least a portion of the electrically charged and induction charged flakes to migrate due to an electrostatic force based on at least the electrical field and a conductivity of the respective flakes, transiting and piercing into the surface of the gate layer, the gate layer being configured to prevent discharge of the charged flakes and thereby selectively causing an electrostatic accumulation buried into the gate layer, and the conductive substrate being configured to discharge the induced charge on the electrically charged and induction charged flakes with an opposite polarity induced charge, by contact with the conductive substrate, to thereby selectively inhibit electrostatic accumulation of the flakes on the surface of the conductive substrate exposed to the gate layer, wherein the flakes have a major axis, and wherein the electrical field affects an alignment of the major axis of the flakes, further preserving the alignment of the major axis of the migrated flakes to form a uniform coating of the flakes with one portion of the flake buried within the gate layer, and the other portion of the flake protruding from the gate layer, the flake having an orientation normal to the planar surface.

Afterwards the gate layer changes state to a stiff gel, a semi solid, or a solid state, fixing the flakes permanently with their major axis normal to the conductive substrate.

U.S. Pat. No. 8,066,967B2, 2011, Eberlein et al. teaches: "The processes described (to deposit carbon nanofibers) . . . " (but in our embodiments, to deposit dichalcogenide flakes) " . . . depends on two forces: The coulombic force-charge times electrostatic field intensity AND the dielectrophoretic force permittivity times the gradient of the electrostatic field."

U.S. Pat. No. 8,066,967 B2, 2011, Eberlein et al. also teaches "once the carbon nanofibers are adhered to the cathode, they become asymmetric, allowing one end only to be derivatized or otherwise subject to different mechanical, electrical, or chemical conditions." Applying an electrostatic voltage perpendicular to a surface of the nano-porous substrate aligns the plurality of carbon nanotubes perpendicular to the surface.

Mos2 is strongly responsive to electromagnetic fields. And the MoS2 flake has its strongest electromagnetic response along the major axis of the flake, which is synonymous with the longest axis of the flake.

Electromagnetic field deposition of dichalcogenides occurs as a result of industrial processes such as continuous inkjet printing (CIJ), xerography, electrophotography, photocopying, laser printing, electrophoretic aka electrophoresis, pressure less printing, corona poling, electrostatic spraying, flocking, among other processes.

During these electromagnetic deposition processes, an electrical charge is applied to the MoS2 flake. The charge can be positive or negative. After an electrical charge is applied to the MoS2 flake, the flake is brought into proximity to a substrate or electrode of the opposite electrical charge, causing the flake to be attracted to the oppositely charged substrate or electrode.

Since the greatest charge polarity is along the major axis of the flake, the flake is planted with its major axis normal to the electrode or substrate.

In some embodiments the electrode or substrate with the opposite charge is coated with a gate layer, or other layers. The edge of the flake penetrates the gate layer, creating conformal contact with the electrode, creating ohmic contact with the electrode.

In some embodiments the molybdenum metal atom has available valence domains which can associate with the available electrons of the charge transfer layers or electrode. The orbitals of the Molybdenum atom overlap those of the electron orbitals of the charge transfer layer atoms, creating ohmic contact between the molybdenum atom and the charge transfer layers.

FIG. 3 illustrates a specific, generic, but non-limiting example of an ohmic interaction between the valence domains of a molybdenum disulfide molecule and the valence electrons of a charge transfer molecule, a polythiophene molecule. The orthogonal p electrons from the pi bonds in the thiophene ring donate electron density binding the Molybdenum atom comprising the Dichalcogenide Flake. This type of interaction is known as a dative bond or coordinate covalent bond. The thiophene acts as a pi electron donor ligand. Other examples of bonds, such as ionic bonds, polar covalent bonds, and others can also form ohmic interactions. The Dichalcogenide Flake has available valencies that associate with the valence electrons of adjacent charge transfer molecules, said association being ohmic interaction. The electrical conductivity between the valence domains of the molbydenum sulfide flake and the electrons of the adjacent charge transfer molecules is at least about $1 \times 10^{6th}$ Siemens per meter.

The charged flake remains oriented normal to the electrode with the opposite charge. In some embodiments the gate layer is comprised of an ultraviolet radiation curing resin. After the flake is planted in the ultraviolet curing resin, the low viscosity resin is cured, and the flake is permanently oriented normal to the electrode. One portion of the flake remains buried in the resin, while the remainder of the flake protrudes from the surface of the resin, the gate layer.

In some embodiments the oppositely charged electrode is a relatively soft durometer conductive polythiophene. In some cases, the flake is attracted with such strong force that the flake pierces into the surface of the conductive polythiophene electrode. In some embodiments, the Molybdenum atom has available valence domains associating with the available electrons of the atoms of adjacent charge transfer molecules, the pi electrons of the thiophene ring of the PEDOT molecule, the polythiophene said association being ohmic contact between said valence domains of the flake and said available electrons of these charge transfer molecules.

Xerography and Similar Processes to Depose Dichalcogenides

Tse differing electrical deposition processes share many similar materials, processes, accessories, and nomenclature; such as dry toner, liquid toner, photoconductor, dry cascade, magnetic brush, fur brush, powder cloud, corona wires, exposure, carrier, and developer.

Toner is a very fine, dry powder medium used in the electro photographic or xerographic process. It is composed primarily of dichalcogenides, resin, wax, and process-enhancing additives. The term xerography, in fact, is derived from the greek words xeros, 'dry' and graphia, 'writing,' reflecting how toner rather than ink is used in the imaging process. Toner particles become electrically charged when stirred or agitated through the triboelectric effect. The composition of the toner not only contributes to its imaging characteristics but to its ability to maintain and control its charge properties. Also, the shape of the toner is a factor in its charging capability. This electrical charge is what allows the toner to be precisely manipulated throughout the process. [1].

The dichalcogenide receives an electrical charge, and is drawn to the substrate, as the substrate has the opposite electrical charge. The dichalcogenide flake is partly buried within the ionic liquid gel. The ionic liquid gel is immediately photopolymerized, maintaining the position of the flake, and the major axis of the flake is permanently oriented.

Dry toner commonly comes in Mono Component and Dual Component forms.

Mono component toners incorporate the magnetic material, including dichalcogenides in the composition of the toner particle itself. Mono component devices rely on a single consumable cartridge that contains drum and toner, which consists of finely powdered plastic, magnetic particles including dichalcogenides and additives to promote proper flow and fusion. [1].

Dual component toners have the magnetic material, including dichalcogenides, mixed together with the toner but as separate components. Dual component designs separate the magnetic materials from the toner and place them in a developer that constitutes a separate consumable part.

Liquid toners are advantageous over dry toner in their ability to go very fast plus its high quality of output. Liquid toners contain dichalcogenides and other materials. Often liquid toners are dispersed in an oil that evaporates during the fusing process. Liquid toners are used in digital presses that are typically used for commercial printing on a wide range of coated papers. Liquid toner digital presses have the ability to print digitally generated images using liquid electrostatic ink, meaning no plates are necessary.

There are at least five processes of charging the toner, each affecting machine design, the quality of the final print, and to a certain extent, the speed at which the machine can print, and the characteristics of the dichalcogenides and the other ingredients which comprise the toner. A non-limiting list of these processes are: Ionic transfer or dry cascade, Electrophoresis or liquid dispersion, Magnetic brush, Fur brush, and Aerosol or powder cloud.

There are several ways in which the charge can be placed on the photo-conductor (PC). An alpha-emitting radioactive source can be placed close to the free surface, and ions of one polarity produced from the air ionization created by the emitted alpha particles can be swept to the plate by means of an applied field. Or a conductive rubber roller with a potential applied between the conductive core of the roller and the conductive backing of the photoconductor can be rolled over the plate, applying charge. Or the surface can be sensitized by a charge from a charged insulator placed in contact with the free surface. Or a charge can be induced by bringing a conductive surface near the plate, applying sufficient potential between it and the substrate, and simultaneously flooding with light. [2]

A screen-controlled charging device may be operated with a wide variety of corona and screen voltages in order to charge a xerographic photoconductor to a desired potential at a given charging rate. To charge at a high rate of traverse, either or both the screen voltage and the corona voltage would have to be increased markedly. Increasing the corona voltage is undesirable because of the increased demands on the power supply, and because of the greater possibility of arcing. It is possible, however, to increase charging rates with the device by several techniques. [4]

Electrostatic fields play a fundamental role in electro-photography. Initially, a PC is completely uncharged, so if light is absorbed within the photo-generating medium, the electron-hole pairs experience no net electric field which would force them to drift in opposite directions. This being the case, photo-generated electron-hole pairs would recombine to restore charge neutrality. Electro-photography depends upon the intentional separation of the electron-hole pairs; thus, it is necessary to establish an electric field within the PC film. A uniform charge distribution at the PC surface is generated by adsorbing ionized gas molecules that arise from an electrical corona device. In their most simple configurations, these devices employ thin wires (about 50 m diameter) set to very high potentials (5-10 kV). The electric field within the vicinity of the wire is so high that any free electrons are accelerated to velocities sufficiently high to impact ionize an intervening gas molecule. The corona wires are thus sources of gas ions whose polarity is the same as that of the wires. In [5] E. M. Williams stated that "A simple device for corona charging could consist of one or more fine wires supported on insulating blocks and placed about midway between the photo-conductive surface and a grounded conductive surface parallel to it. Such a device, however, suffers from several serious limitations."

First, at a reasonable rate of traverse of the charging unit, only a few micro-amperes are needed to charge a photoconductive surface to the few hundred volts desired. In order to prevent overcharging, therefore, the corona unit would have to be operated at a corona potential only very slightly higher than the corona threshold of the wire. Variations in the wire diameter, discontinuities in the wire, and dirt on the wire will affect the threshold potential, and thereby change the emitted corona current markedly at the points of wire non-uniformity. This, in turn would seriously affect the charge on the photoconductive surface. [6]

Secondly, because of the small voltage change on the photoconductor during charging, in relation to the corona voltage, the corona current to the photo-conductive surface will be essentially constant. Thus, there would be little control of the charge placed on the surface if there were variations in speed of traverse, or in the corona voltage. It has been necessary to design more elaborate charging devices to minimize these defects.

In the xerographic processes, the charging current must be uniform across the width of the PC or paper, and it must be reasonably stable under a variety of environmental conditions. Corona from a bare wire suspended above a PC would indeed charge the PC surface, but such a simple device suffers from emission non-uniformities; therefore, it has a tendency to overcharge the PC in some regions and undercharge it in others. The corotron was invented to solve the problems encountered with bare corona wires and non-uniform charging. [7]

The corotron is a corona wire having an auxiliary electrode either above or around the wire to define the electrostatic field geometry and potentials in a controlled manner. Since the corotron is used as a current injector, the efficiency is rather low if the wrap angle of the shield is large (i.e., small gap) or if the wire is located too far from the gap opening; moving the wire close to the gap improves the injection efficiency.

In order to establish external fields that accurately represent the charge density of the latent image, it has been found that a low potential conducting surface can be placed in close proximity to the free surface of the photoconductor. Ideally such an electrode, called a "development electrode," should be held in virtual contact, but this is usually neither practical nor necessary.

Brush development techniques provide solid area development when a conductive brush is employed, in this case the brush itself serves as a development electrode. For powder-cloud or liquid development, development electrodes can be brought as close as general flatness considerations make reasonable; distances of from 0.4 to 0.6 mm have been commonly used, even though the external field may be only 1 to 2 percent of the total field which could be associated with the surface charge. In the case of cascade development, the diameter of the carrier commonly used is about 0.5 to 0.7 mm and therefore larger spacing must be provided. Various studies have indicated that a spacing of 1.5 to 2.5 mm satisfies this requirement for flat plate development but is unacceptable in rotary machines for several reasons. [8]

The time of development is limited in rotary machines and closely spaced electrodes retard the flow of developer. Secondly, while no adverse bead jamming is evidenced with flat plates, the relative motion of the rotary drum and the developer electrode causes very serious abrasion of the selenium drum by the developer beads.

Central to any electrophotographic process is a photo-generator photoconductor, which is a PC. This is a material that generates and transports electron-hole pairs in response to absorbed photons. A PC is usually thin (about 10-50 micrometers) and is coated onto a ground plane.

Some of the early office copiers used a layer of selenium coated onto a metallic drum: when the PC became damaged or worn out, the entire drum would be replaced with a new one.

Organic polymers were developed later, and the technology produced many materials that could be mixed in flexible binders and coated onto webs of aluminized Mylar substrate. Organic photoconductors were thus made into long narrow sheets. These were rolled up and placed inside a PC drum around which the PC sheet was wrapped: hence, the PC could be replenished from the supply role as needed. Another approach uses a PC web that has been joined to make a seamless belt: when the belt is worn or otherwise damaged, it can be replaced easily with a new one. [10]

Photoconductors useful in xerography are chosen, among other reasons, for their insulator-like behavior when kept in the dark. If one charges the PC surface with gaseous ions from a corona device, the surface potential (most often called the "dark voltage") is directly proportional to the surface charge density and is inversely proportional to the capacitance per unit area of the PC. The dark voltage is usually limited by the dielectric breakdown strength of the PC film. Useful values of dark voltage range from +500 to +1000 volts. When exposed to a pulse of light from a xenon flash tube or a scanning laser beam, for example, some of the photons absorbed by the PC will create electron—hole pairs. These charge carriers experience an electric field caused by the gas ions adsorbed to the PC surface, if these ions are negative, the electrical force on the holes is toward the film surface, whereas the electrons are directed toward the ground plane.

In the first place, there must be a photoreceptor. This is a surface upon which the light and dark shades of the original fall in the form of words, figures, and line diagrams, tonal and half-tone pictures. The three best known and most widely used surfaces are amorphous selenium, zinc oxide, and Elfasol compound.

All three photo receptors in their basic form operate successfully as electrostatic image forming surfaces. [11]

It is well known that certain elements and compounds have the characteristic of conducting a flow of electrons, and that certain other elements and compounds act as a barrier to this flow of electrons which we call electricity. The barrier type elements and compounds are known as insulators and the carriers of electrons are called conductors, A third group of elements or compounds called semi-conductors can act in either capacity, given the necessary inducement. When the inducement to change its electrical behavior is the introduction of light energy, the semi-conductor elements and compounds are also known as photoconductors. The phenomenon is known as photoconductivity, first demonstrated by W. H. Allwachs in 1888. [12]

The electrical potential required across the photoreceptor layer to sensitize it can be applied in several ways. Carlson simply rubbed his original sulfur films to charge them by triboelectrification. Uniform, intense fields can be produced more readily by a method which utilizes a corona discharge at a fine wire. In this method, the ions generated around the wire are driven down onto the photoreceptor by the electrical forces between the wire and the photoconductor, typically a 0.0035-inch wire spaced 3 inch (about 1 cm) from the photo-receptor is operated at a potential of about 8,000 volts. Such a unit might sensitize.

When charged by corona, the selenium xerographic photoreceptor behaves as a simple capacitor in which the corona-charged, air-selenium interface constitutes a virtual blocking electrode.[14]

A number of attempts have been made to describe the potential discharge in the dark by complex capacitor networks. The lack of success of these attempts is perhaps not surprising since dark discharge takes place as a result of several mechanisms. These are:

injection of charge from the top surface of the selenium layer, injection of charge from the metallic substrate into the selenium layer, and charge generation within the amorphous selenium layer.

The corona-generated charge appears to deposit in surface states sufficiently deep to prevent the injection of most of this charge into the bulk dielectric material. It is possible through appropriate treatment of the free surface of the selenium layer to make a substantial reduction in the charge injected from that surface. Ordinarily selenium photoreceptors as manufactured exhibit higher dark discharge than they do following some frictional contact with the materials used for developing the electrostatic image. This behavior led to the discovery that selenium plates could be "broken in," or made to exhibit lower dark discharge, by treatment of the selenium surface with certain electron donor substances. Further investigation revealed that increase in dark discharge rate could also be brought about by treatment of the selenium surface with acceptor materials.

When an amorphous selenium layer is illuminated in the visible region of the spectrum, about 25% of the incident light is reflected. Of the remainder, light of wavelength less than about 5,800 A is absorbed within the layer thicknesses generally used and that longer than 5,800 A is transmitted. Absorption is very strong below 5,500 A, with more than 63% attenuation occurring within 0.125 w of the incident surface. However, for reasons which are not yet known, light of wavelength between 5,500 A and 4,800 A yields very little photo-conduction, whereas below 4,800 A the quantum efficiency rises rapidly to about one at 4,500 A, where one absorbed photon produces about one mobile charge carrier.

When a unit area of a charged amorphous selenium photoreceptor is exposed to actinic light its surface potential decreases by an amount related to the number of incident actinic photons.

Office copying and duplicating machines expose the charged PC by reflecting light from the original document and then process this radiant energy by lenses and mirrors to form an image on the PC. Some copiers scan the document in synchronization with the moving PC, others use high energy flash lamps in conjunction with optics that focus the image onto the curved PC surface. Compared with laser beam printers, it is much more difficult to control the exposure energy at the PC in copiers, since the original documents have a wide range of reflectance values. Different papers and inks have unique spectral reflectance characteristics, so the light falling on the document must have broad spectral bandwidth. Gallo and Hammond (1976) discuss gas discharge lamps for electrophotographic exposure. [16]

The image exposure process generates a latent electrostatic image at the surface of a photoconductor. This image is converted into a visible one by depositing a toner comprised of charged dichalcogenide and other materials on the PC surface, where the field polarity relative to the toner polarity selectively deposits toner at the image regions.

Good quality image development may be obtained with two-component (toner and carrier) and monocomponent (toner only) developers. Two component developer's toner transported on the surface of magnetic carrier beads, and the toner particles in monocomponent devices are formulated with dichalcogenides. In some embodiments these dichalcogenides can be tailored to have magnetic properties. These toner particles are smaller than the carrier beads which are much larger and are usually distributed over the range from about 70 to 250 microns and are used to charge and transport toner. Carrier beads are made from carbon-steel shot or ferrite particles with a surface coating, often PTFE or a mixture of PTFE and epoxy. This surface must function reliably in two important ways. Toner must charge with the appropriate polarity when it touches the carrier surface, and the surface energy must be low to inhibit permanent adhesion of toner. Temporary adhesion of toner is necessary, otherwise toner could not be transported in a controlled manner to the latent electrostatic image. Suppose, for example, that toner receives electrons from an insulated carrier surface and that a positive electrostatic field detaches the toner at the PC surface. Because charge is conserved, the positively charged carrier would be attracted electrostatically to regions of negative field. In the absence of magnetic forces in the opposing direction, the remaining important force would be gravity. Gravity is strong enough to overpower electrostatic forces if the mass of the carrier is sufficiently large.

Within this device, toner is mixed and charged by contact with carrier beads. The carriers are recirculated by the magnetic brush "pumps" and fresh toner is added to maintain constant toner concentration in the mix. The magnet arrays are fixed while the cylindrical sleeves rotate around the magnets, thereby transporting toner and carrier past the PC image. The magnetic brush adjacent to the PC is conducting and is biased to assist in developing large image areas. [1]

The developed image is transported to a device that places a substrate in intimate contact with the toned image and the pc. In some embodiments the substrate is charged with an electrical charge opposite that of the toned image and pc with a field of correct sign and magnitude, toner is attracted to the substrate, and, upon separating the substrate from the pc surface, the toner image is transferred faithfully to the substrate. In many copiers and printers, this step of the process is accomplished with an electrical corona device called the transfer corona unit. Machines using positive toner have a negative transfer corona unit. Corona per se is not required to achieve toner motion from the pc to the paper; transfer by corona is only one means to an end. A conductor at high voltage can produce electric fields of sufficient amplitude to transfer toner, although such devices often generate corona breakdown, or worse, sparking. About half of the energy in a spark is dissipated acoustically; thus, the sound wave generates pressures sufficient to dislodge charged toner and impair the quality of the transferred image. [2] Toner transfer is similar to image development, but with different geometry involved. As in development, there must be intimate contact between substrate and toner for transfer to occur. Without an attractive electric field present, toner remains on the PC. This is similar to the particle adhesion phenomenon involved in the development step; thus, dispersion forces and electrostatic forces play central roles in the transfer of toner.

Toner transfers readily to metal sheets, insulating films, and paper.

In a method which might also be classified as a transfer development system, toner is selectively released from a uniformly dusted xerographic surface.* No plate cleaning is required in this method: instead, an optically dense layer of toner is restored on the xerographic surface after each print.

A xerographic plate, uniformly dusted with toner, is charged by corona means to between 500 and 1000 volts. This puts positive charge on the toner and any uncovered areas of the xerographic surface. An equal and opposite charge is induced in the conductive substrate, providing a force of attraction between the charged toner and the substrate.

H. Dessauer stated in his book, "Xerography and Related Processes": "During image exposure the induced charge migrates to the dusted surface of the photoconductor where it still exerts an attractive force on the toner."

A substrate is brought into gentle contact with the dusted surface using a low-potential, conductive, soft roller. In the areas not illuminated during image exposure, most of the charges induced in the substrate are now replaced by charges induced in the adjacent substrate surface. These attract and cause toner transfer to the substrate. In non-image areas, however, toner is retained by the charges in the xerographic layer.

In principle, it is not essential that the plate and toner be recharged, but in practice it does result in more uniform dusting in succeeding steps.

Xeroprinting:

Generally speaking, xeroprinting depends upon different electrical properties of an Image area vs. the background areas such that charge is retained only in the image areas. This allows repeated cycles of charging, development and transfer steps to permit printing of many copies.

Specifically, xeroprinting employs an insulating image on a metal substrate. The insulating image may be prepared by a xerographic process where the toner image is transferred to a metal plate and fixed, by heat or solvent, to the metal substrate. [4]

In use, the xeroprinting plate is charged electrically by corona. The insulating areas retain electrical charge whereas the metal areas, unprotected by the insulating image, do not retain the electrical charge. Printing is then accomplished by applying a powder comprised of dichalcogenide flakes to the electrically charged plate. The powder is attracted and adheres to the charged areas like the development step in conventional xerography. The powder image may then be transferred to paper or other material by electrostatic methods as is done in xerographic copying. After transfer, fixing is accomplished, by either solvent or heat, in the usual manner.

The insulating pattern employed in xeroprinting may be prepared by photo-chemical techniques, by xerography, by typewriting, or by any other method of applying an insulating image. It is essential that the image material be a good insulator. In cases where the xeroprinting image is not sufficiently insulating, a "topping powder" can be applied to a tacky original pattern and then fused to provide increased charge retention.

Electrostatic transfers are most easily made to thin materials that are insulators or poor conductors or materials with a low lateral conductivity. Transfer may be made to metal sheets (for instance to metal lithographic masters if the metal is prevented from shorting out to the backing plate of the xerographic plate, either at the edge of the selenium layer or through imperfections in the selenium. With this precaution done, the transfer can be accomplished without the use of corona by momentarily applying a potential to the metal sheet. The method is subject to the hazard, however, that a microscopic imperfection in the selenium layer can result in an arc that will produce a visible flaw and perhaps a permanently damaged plate. [4]

To solve this problem of imperfections in the selenium plate, the selenium plate bearing a toner image is once again charged positively in the dark, so that the toner has a positive charge and the exposed selenium in non-image areas also has a positive charge. Then a flexible metal sheet electrically connected to the backing of the selenium plate is brought into contact with the image. The field induced between the metal sheet and the xerographic plate is sufficient to cause the toner to transfer to the metal sheet without any chance of damage to the selenium layer. A useful refinement of this technique involves first making a negative transfer of the "fringe" area toner to a sheet of paper that is discarded, thereby leaving a background-free image to transfer to the metal master.

Magnetic Brush

Another major variation of carrier development is magnetic brush development. The magnetic brush is composed of a mass of very small iron particles which tend to link up into fibers in the presence of a magnetic field. The long iron "bristles" of the magnetic brush orient themselves along the lines of magnetic force, forming a structure which plays the same role as the fibers of a fur brush. When an appropriate toner containing dichalcogenide flakes is mixed with the magnetic powder, it is charged triboelectrically in the same way as with the cascade system. In the case of the magnetic brush, however, the carrier is approximately the same size as the toner, rather than being much larger. When the magnetic carrier-toner mixture is picked up by the magnet, the brush is formed with the charged toner particles clinging in a random fashion to the iron particle bristles. The developing action of the magnetic brush is much the same as that of the fur brush, and like it, is not dependent on gravity flow for its of magic the experimenter feels when making his first images by magnetic brush techniques. [6]

Since the bulk of the developer is conductive, a low potential surface is presented to the photoconductor, and, as a consequence, the field is modified, and solid-area coverage is achieved in the development. This turns out to be a mixed blessing; systems in which development is based on absolute potentials, rather than adjacent differences in potentials, require much more critical control of image exposure.

High quality line-copy images can be produced by this development method. Continuous-tone images are reproduced with excessive contrast, however.

Fur Brush:

A carrier development system closely related to cascade development is that of fur brush development. In this method toner is dusted into a fur brush, say of cylindrical shape, and the brush is rotated and moved into contact with the electrostatic image. Some mechanical agitation between the toner and the brush is desirable in order to obtain adequate charging of the toner in its triboelectric relationship with the fibers. The fibers perform the charging function in much the same way as do carrier beads, and also the process of stripping toner from the brush bristle requires some minimum force which tends to give a threshold of development which is desirable for document reproduction.

As with cascade carrier, the brush bristle must be able to lose its net charge, to counterbalance the charge carried away by the toner. Natural fur is sufficiently hygroscopic to leak such charge away in normal usage at about 10% RH, provided the bristles can either touch the housing during rotation or be somehow grounded through the hide. However, natural fur does not behave in this manner at low relative humidity. Under such conditions, natural fur brushes accumulate charge after brief usage, creating fields that suppress development. Various other methods of neutralizing the brush have been studied, such as combing it or flooding it with corona-generated ions. Most synthetic furs are not sufficiently hygroscopic to permit their use in this application. [7]

Cascade Development:

With the cascade development process, if a toner comprising dichalcogenides and polymer and other ingredients is mixed with somewhat larger particles having a different triboelectric value, the toner will acquire a preferred charge from the other particles and will adhere to the particles in a charged state. The larger particles are called "carrier," and the mixture of toner and carrier is called "developer." It is commonly called "cascade developer," because in use the mixture is poured or "cascaded" over the inclined surface of a xerographic plate or drum bearing an electrostatic latent image. The same developer can be used with various other developing techniques that have not been deeply studied. If the toner is electrostatically negative, the toner will be stripped from the carrier in the more positively charged areas of the xerographic surface by the strong fringing field forces and will produce an image. [8]

In the case of document reproduction, the image has strong contrasts at the edges of the characters, so that the Principal forces present are those from fringing fields. As the carrier rolls, bounces, and slides, its general performance will depend on the angle of inclination of the plate and the degree to which the various particles perform individually or as a mass. The gross results are surprisingly insensitive to changes in these actions, but optimum image quality is dependent upon careful choice of the many variables present, including details of the cascading actions, particle sizes and triboelectric relationships.

Cascade development is also well suited to negative-to-positive development systems. If the more straightforward method of development of charged areas is called "charged-area development," then one can call negative-to-positive development "discharged-area development." In the latter case, the lines of force terminating in the discharged (wholly or partly) areas of the exposed character image are utilized to drive toner down into that area. This process requires the use of toner of a charge polarity like that used to sensitize the surface of the photoconductor.

Insofar as cascade development is concerned, discharged-area development is almost identical in general characteristics to charged-area development, especially for rotary machines. With almost negligible differences it has been possible to obtain two thermoplastic toner materials which can be charged to one or the opposite polarity in contact with a carrier, so that only three materials are necessary to form both systems. A more common practice has been to use a single toner material and two choices of carriers which can charge it oppositely.

Among the electrostatic considerations to be kept in mind for cascade development and other types of carrier development is the fact that the source of charge for the toner is the carrier material. As the toner is stripped away, the carrier is left with a net charge which cannot be permitted to accumulate. Hence, the cascade system must involve a mechanism for removing the charge from the carrier. This requirement is usually met by providing a grounded metal surface somewhere, for the developer to contact.

This mechanism accounts for one of the major useful features of cascade development, and of other carrier methods to varying degrees. The fact that the potential in background areas does not lead to attraction of toner means that the process produces an undeveloped or white background in document reproduction regardless of exposure. The principal requirement of exposure in this case is to produce adequate electrostatic contrast for stripping toner from carrier, rather than to produce any particular level of potential in the back-ground areas.

Aerosol Development

Aerosol method or powder cloud method is a specialized commercial application. A xerographic photoreceptor once charged can be selectively dis-charged by irradiation with X-rays, therefore the process can be used for medical examination, and industrial non-destructive testing purposes by placing the subject to be examined between the X-ray source and the charged photoreceptor. Breaks or dislocations in bone structure or hair-line flaws in castings can be revealed and prints of these can be made on normal film substrates or unsensitized paper.

The aerosol method or powder cloud method uses a gas-normally air-under pressure to convey toner comprised of dichalcogenides and other ingredients through a nozzle in order to create a cloud of toner suspended in air in the vicinity of an electrostatically imaged photoreceptor. By lining the nozzle with the special materials used for coating the carrier bead, the toner is charged to the correct polarity. Other methods of charging the toner that issues from an aerosol nozzle include passing the particles through a corona dis-charge on their way to the image. [1]

In open chamber cloud development process, if a charged air suspension of toner particles is allowed to drift near a xerographic electrostatic image, the area in question, and will cause especially strong development at the edge. [2]

In the case of an extended edge dividing two effectively semi-infinite planes at different potentials, the development will generally be confined to the charged, or less exposed side of the boundary, and will be very strong at the edge, declining in density with distance away from the edge, and approaching a very low value when the distance from the edge becomes large compared to the extent of the fringing field. This characteristic of the system leads to an image of peculiar appearance, but highly suitable for the detection of discontinuities as needed in radiography.

Ions from a corona discharge can be used to charge aerosols. It is generally necessary to cause the aerosol to pass directly through a corona discharge from a fine wire or a sharp point. The charge imparted to the aerosol by the ions from the corona discharge is super-imposed upon the aerosol charge due to triboelectrification.

A variety of means have been investigated for creating aerosols from fine dry toners. With one exception, no commercially available devices are known that produce aerosols satisfactory for xerographic development; most of the devices described here were developed specifically for Xerography. The simplest of these may consist of no more than a brush or a series of brushes arranged to sweep across a powder-laden surface such as an impregnated cloth or screen. Such devices can be made to create dense clouds, but the clouds generally contain not only the finely divided toner but also agglomerates of the toner. To prevent these agglomerates from reaching the surface to be developed, it is necessary to locate baffles in the direct path between the brush and the surface. Under such conditions development rates are low because most of toner is deflected on the baffles. [4]

Aerosols consisting of liquid droplets suspended in a gas can also be used for development. One attractive feature of liquid aerosol systems is that the aerosol particles can be charged through induction techniques. Either dissolved or dispersed materials are added to form the image. The aerosol of liquid particles can be used in two ways: [4] 1. Liquid particles containing dichalcogenides can be deposited on the surface to be developed. 2. The liquid can be caused to evaporate during the time between aerosol generation and deposition so that dry dichalcogenide flakes are deposited.

In some embodiments the dry flake is partly buried in an ionic liquid gel. In some embodiments the flakes penetrate through the gel and form intimate contact with the electrode, or the electrode interface layer. In an embodiment where the electrode includes polythiophene, the edge of the flake penetrates into the soft polythiophene coating.

Method 1 has the advantage that the wet image can be transferred solely by capillarity to a suitable substrate. Particle size can be smaller in method 2 in which liquid droplets containing a dissolved or suspended solid material can dry in transit to the development zone where they are deposited as dry particles.

Rapidly moving aerosols can be charged by impingement upon a suitable material. In practical development systems the aerosol is passed through a fine-bore tube of the material. When the flow is turbulent the fine tube serves the dual function of charging the aerosol and reducing agglomerates. Metal tubes, such as copper, brass, nickel, and stainless-steel, generally charge most toner materials to a predominantly negative value, Ceramic materials, particularly hydrated aluminum silicates such as steatite (soapstone), charge most developer materials predominantly positive. [5]

Electrostatic Stencil Printing

In electrostatic stencil printing, a powder comprised of dichalcogenides and other ingredients, is transferred through a fine mesh metal screen on which the image areas are open screen, and the non-image areas are masked. The finely divided dichalcogenide powder is applied to the back of the screen, where it takes on the charge of the screen, and is attracted through the openings toward the receiving sheet or paper, which has an opposite potential applied to it. Because potentials up to 3000 volts are applied across the gap from screen to paper, the powder travels in a relatively straight line, yielding good resolution. The stencil screens are made by the silk screen process.

Certain advantages are evident with electrostatic stencil printing. The spacing possible between the stencil screen and receiving surface allows relatively rough surfaces to be printed, including porous or fibrous surfaces. Heat-fusing is used with this method, which is consistent with other electrostatic imaging processes.

Pressure-Less Printing:

Pressure-less printing allows things to be printed on without being touched. It raises possibilities of printing on soft fruit, shaving cream and even the yolk of an egg. It is an electrostatic process and the equipment consists basically of a fine mesh metal screen bearing a stencil and a conductive backing plate parallel to it a short distance away. A very fine toner powder containing dichalcogenide flakes is applied to the screen where it acquires a positive charge, either by the triboelectric effect of the friction by the ink applicator on the screen or by charge transfer from the screen, or both. The positively charged particles are attracted through the screen and across the gap towards the negatively charged backing plate. [7]

The article to be printed is interposed between the screen and the backing plate so that a powder image, conforming exactly to the pattern on the stencil, is deposited on it, in much the same way as the image on a Xerox plate or drum.

The potential is applied to the rollers by means of a brush electrical contact, and the image is fused by passing between infra-red heating lamps.

Preparation of the stencil screen is comparatively simple. In one method the screen is coated with a bichromate gelatin solution and allowed to dry in the dark. This light sensitive gelatin is exposed to ultra-violet light through a photographic film positive, whereupon the exposed (non-image) areas are hardened. The unexposed (image) areas are washed out by soaking the screen in hot water, the screen then being immersed in a hardening solution to give the gelatin more durability.

The image is subsequently fixed by heat or solvent vapor. The surface configuration of the article being printed is immaterial because the ink particles travel in a straight line. Almost any medium is suitable for printing by this means except ones that interfere with the electrical field.

Continuous Inkjet Printing

Inkjet printing is a type of compute printing that recreates a digital image by propelling droplets of ink containing dichalcogenides and other ingredients onto paper, plastic, or other substrates. Inkjet printers are the most commonly used type of printer and range from small inexpensive consumer models to expensive professional machines.

All inkjet technologies are based essentially on digitally controlled ejection of drops of fluid from a print head on to the required substrate. However, this can be accomplished by a variety of methods. Inkjet technology most typically classified as either continuous inkjet printing (CIJ) or Drop on demand printing.

Continuous inkjet printers are consistent with the principles described in this patent since the ink receives an electrical charge. However, it is uncommon for drop on demand printing technologies such as the Epson piezo inkjet or the HP Canon bubble jet to apply a charge to the ink drops.

In some embodiments the dichalcogenide flakes are dispersed in a liquid mixture, such as solvent, or water, or a mixture of solvent and water. In some embodiments the liquid mixture functions as a fluid which is distributed by a continuous inkjet printer (CIJ).

Continuous inkjet printers discharge ink to print directly on a target. This is a non-contact method which can print on any type of target without blurring, printing flaws or damaging the target.

In CIJ technology, a high-pressure pump directs liquid ink containing dichalcogenides from a reservoir through a gun body and a microscopic nozzle, creating a continuous stream of ink droplets via the Plateau-Rayleigh instability. A piezoelectric crystal creates an acoustic wave as it vibrates within the gun body and causes the stream of liquid to break into droplets at regular intervals: 64,000 to 165,000 droplets per second may be achieved. The ink droplets are subjected to an electrostatic field created by a charging electrode as they form; the field varies according to the degree of drop deflection desired. This results in a controlled, variable electrostatic charge on each droplet, and the dichalcogenides dispersed within it. Charged droplets are separated by one or more uncharged "guard droplets" to minimize electrostatic repulsion between neighboring droplets.

The charged droplets pass through another electrostatic field and are directed (deflected) by electrostatic deflection plates to print on the receptor material (substrate) or are allowed to continue on undeflected to a collection gutter for re-use. The more highly charged droplets are deflected to a greater degree. Only a small fraction of the droplets is used to print, the majority being recycled.

Continuous Inkjet Printing Steps

1. Pressurized ink comprised of dichalcogenides, carrier liquid, and other additives is supplied to the print head from the controller.

2. Ink containing dichalcogenides is fed to the nozzle which has the piezoelectric oscillator and discharge hole.

3. The ink is discharged while being oscillated by the piezoelectric oscillator, and it is simultaneously given an electrostatic charge. The ink is formed into an ink column, but when saturated with charge, the ink becomes particles, and those particles separate from the ink column due to Plateau-Rayleigh Instability. The electrostatic detection sensor monitors the ink particles to ensure they receive the appropriate electrostatic charge to prevent malfunction.

4. The ink particles that discharge from the nozzle pass between two deflecting electrodes where an electrical field is generated by a voltage of around 7000 V. At this time, a bending force acts on the ink particles according to their electrostatic charge to change the direction they travel or transit. Synchronously, the target or print head is moved perpendicular to the ink particle travel direction to print the desired content.

5. Ink not used for printing is collected in a pipe called the gutter and reused.

6. In some embodiments, the substrate or electrode has an electrical charge different from the transiting flakes and attracts the flake to a dielectric coating on the desired substrate.

7. In some embodiments as the drop transits, the low flash point carrier liquid evaporates from the drop, and the dichalcogenide flakes penetrate into the dielectric coating covering the substrate.

8. Then the coating covering the substrate is polymerized, fixing the position of the a flakes.

Flocking

In some embodiments, the dichalcogenide flakes can be deposited by flocking processes.

U.S. Pat. No. 3,979,544, 1976, Kolbe et al. teaches "The principle upon which flocking is based is that, in the electrostatic field, the fibers are charged either by mutual contact or by electrostatic induction, as a result of which they are given a polarity which aligns the fibers parallel to the lines of force of the electrical field. Under the effect of the attractive, opposite charges, the fibers are simultaneously attracted by the opposite pole and are thus anchored in the layer of adhesive coating the substrate. However, after the fibers have been anchored in the layer of adhesive, the charge applied has to be dissipated sufficiently quickly, because the charge present in the fibers itself induces an electrical field and, hence, prevents the formation of a uniformly compact surface."

The flakes are oriented along their major axis as a result of electrostatic induction. The first charging electrode emits lines of electrical field force, which impresses an electrical polarity upon the flake, which is coincident with the major axis of the flake. Since opposite charges attract, under the effect of the opposite charges and field lines emitted by the opposite electrode, the flake is attracted to the opposite electrode. The flake contacts the opposite electrode, with its major axis coincident with the lines of electrical field force emitted by the opposite charge electrode, electrical fields of force which are generally normal to the charge emitter. The flake contacts the opposite electrode with its shortest dimension, the flake edge, in contact with the opposite electrode, and its major axis normal to the electrode.

Electrophoretic Deposition

"Electrophoretic deposition (EPD) or electrophoresis, is a term for a broad range of industrial processes which includes electrocoating, cathodic electrodeposition, anodic electrodeposition, and electrophoretic coating, or electrophoretic painting. A characteristic feature of this process is that colloidal particles . . . "or dichalcogenide flakes" . . . suspended in a liquid medium migrate under the influence of an electric field (electrophoresis) and are deposited onto an electrode. All colloidal particles that can be used to form stable suspensions and that can carry a charge can be used in electrophoretic deposition.

The process is useful for applying materials to any electrically conductive surface. The materials which are being deposited are the major determining factor in the actual processing conditions and equipment which may be used." from Wikipedia.

Electrostatic Coating

"Electrostatic coating is a manufacturing process that employs charged particles, . . . " charged dichalcogenide flakes, " . . . to more efficiently paint a workpiece. Paint, in the form of either powdered particles or atomized liquid, is initially projected towards a conductive workpiece using normal spraying methods, and is then accelerated toward the work piece by a powerful electrostatic charge." from Wikipedia Corona Poling "Corona discharge is a partial breakdown of air, usually at atmospheric pressure, and is initiated by a discharge in an inhomogenous electric field. Corona discharge, aka corona poling, has been used to pole films of electro-optic materials to enhance their electro-optic properties." from Wikipedia.

Corona poling can be used to orient the guest dichalcogenide flakes in the host polymer or gel.

"Although corona poling can be performed at room temperature, poling at elevated temperature has several advantages. For example, raising the temperature in a polymer guest-host system close to its glass-rubber transition temperature before poling increases the mobility of the guest dichalcogenides and host molecules, and allows rotation to occur during poling. If during poling the temperature is lowered well below the transition temperature of the host molecules, the guest molecules" . . . the dichalcogenide flakes . . . "are fixed in their new orientation." from Wikipedia.

Gate Layer Ionic Liquid Gel, Functions as a Novel Mask and/or a Novel Barrier

The bottom source electrode is covered with a gate layer. The gate layer has many functions. Firstly, the gate layer coating maintains the contact between the source and drain electrodes and the semiconductor. In some embodiments the gate layer functions as a barrier to the ingress of water, oxygen, and other materials which might degrade the functioning of the semiconductor. In some embodiments, the gate layer functions as a mask, inhibiting impurities or dopants from implanting to the dichalcogenide flake and changing the characteristics of the buried portion of the dichalcogenide flake. In some embodiments, the coating has dielectric properties, insulating properties. In other embodiments the coating is non-conductive, or semiconductive, or conductive. The gate layer is printed partly overlapping the first electrode, the source electrode, with a consistent coating thickness. In some embodiments, the second electrode, the drain electrode, is coated on top of that gate layer. Sometimes the gate electrode is printed on top of the gate layer.

The gap occupied by the layer and dichalcogenide flakes, the gap between the source electrode and the drain electrode, is defined as the transistor channel length.

Ordinary web printing equipment or sheetfed printing equipment is adequate to print a consistent thickness of the gate layer coating, providing consistent spacing between the source electrode and the drain electrode, to maintain the consistent electrical characteristics of the gate layer.

The gate layer is partly comprised of ionic liquids. Ionic liquids are salts that are molten over a wide temperature range, with a negligible vapor pressure at room temperature.

Electrolytes based on ionic liquids will therefore not dry out but maintain a high ionic conductivity (of the order of 1-10 mS/cm). Ionic liquids also display good environmental and electrochemical stability (e.g. EMI-TFSI has a large electrochemical window of 4.3V) and allow for fast redox intercalation/de-intercalation reactions.

U.S. Pat. No. 8,203,138B2, 2012, Takeya et al teaches "Thus, use of the ionic liquid endows the transistor with high response speed."

With identical device geometry and semiconducting material, an increase in G would allow a TFT to output equivalent current with a reduced operation voltage. Inorganic and organic high-k and/or ultrathin dielectrics have achieved a G on the order of 0.1 μcm 2. Alternatively, electrically insulating but ionically conducting solid-state electrolytes (SSEs) have been utilized as gate dielectrics in TFTs, yielding electrolyte gated TFTs (EGTs). The primary benefits of employing this class of materials is their exceptionally high G (1-10 μcm 2), enabling the operation at <2 V. When a voltage is applied, the ions in the SSE insulators form electrical double layer (EDL) at the interfaces, which can be considered nanometer-thick capacitors, giving rise to the ultrahigh capacitance. Additionally, SSE insulators can be deposited at room temperature, usually by solution-based techniques, allowing them to work with unconventional substrates such as plastic.[55]

U.S. Pat. No. 8,203,138B2, 2012 Takeya et al. teaches "It has been observed that the application of a voltage to the Polymer Gel Electrolyte I causes ions to move, resulting in the formation of a layer in which positive ions are accumulated and a layer in which negative ions are accumulated over a region having a thickness of about 1 nm from the electrodes which, together, form layers in which the balance between positive and negative charges is lost (electric-double layers). In these layers, the electric field is concentrated in a region with a thickness of about 1 nm from the surface of the semiconductor. As a result, even when a voltage as low as 1 V is applied between the gate electrode and the source electrode (or the drain electrode), an electric field as strong as 10 MV/cm is applied in the layers. Accordingly, when the Polymer Gel Electrolyte I am used as the gate insulating layer of a transistor, a stronger electric field can be applied to it at a lower voltage. As a result, many carriers are injected into the gate insulating layer. A high current gain can be achieved even at a low drive voltage in such a transistor."

"In the meantime, there has been proposed . . . " " . . . a field effect transistor with a gate insulating layer made of a polymer gel electrolyte comprised of a polymer gel and an ionic liquid (for example, 1-butyl-3-methylimidazolium hexafluorophosphate)".[56]

After changing phase from a low viscosity liquid to a gel, or stiff gel, or a solid, the ionic liquid gel stabilizes the position of the dichalcogenide flakes, maintaining contact between the flakes and the bottom electrode and the top electrode. In some embodiments, the ionic liquid gel will function as a barrier against moisture absorption and oxygen absorption.

In some embodiments, the ionic liquid gel functions as a mask, preventing impurities from changing the work function of the portion of the dichalcogenide flake buried in the gel. In these embodiments the dopants change only the protruding portion of the flake. In some embodiments impurities change the work function of the unmasked portion of the flake. As a result of doping, that is, implanting impurities, the flake has biphasic work functions, and the single continuous flake functions as a heterojunction. And since the flake functions as a heterojunction without contact resistance between the n portion of the flake and the p portion of the flake, the flake has superior conductance and superior mobility and low current functioning, when compared to heterojunctions comprised of 2 different materials with contact resistance between the 2 different materials, such as the vertically stacked 2D dichalcogenides taught in the scientific literature.

U.S. Pat. No. 8,203,138B2 Takeya et al. teaches "the cation constituting the ionic liquid is selected from imidazolium cations, pyrrolidinium cations, piperidinium cations, ammonium cations, and pyrazolium cations. Further teaching "the ionic liquid is constituted with a cation selected from 1-methyl-3-methylimidazolium, 1-ethyl-3-methylimidazolium, 1-propyl-3-methylimidazolium, 1-butyl-3-methylimidazolium, 1-pentyl-3-methylimidazolium, 1-hexyll-3-methylimidazolium, 1-octyl-3-methylimidazolium, 1,2-dimethyl-3-propylimidazolium, 1-methyl-1-propylpyrrolidinium, 1-methyl-1-butylpyrrolidinium, 1-butyl-1-methylpyrrolidinium, 1-methyl-1-propylpiperidinium, trimethyl propyl ammonium, trimethyl octyl ammonium, trimethyl hexyl ammonium, trimethyl pentyl ammonium, and trimethyl butyl ammonium, 1-ethyl-2,3,5-trimethylpyrazolium, 1-butyl-2,3,5-trimethylpyrazolium and 1-propyl-2,3,5-trimethylpyrazolium; and an anion selected from bis(trifluoromethanesulfonyl)imide, bis(fluorosulfonyl)imide, bis(perfluoroethylsulfonyl)imide, tetrafluoroborate, hexafluorophosphate, and dicyanoamine." And further teaching the ionic liquid is selected from: 1-ethyl-3-methylimidazolium bis(trifluoromethanesulfonyl)imide, 1-ethyl-3-methylimidazolium bis(fluorosulfonyl)imide, 1-ethyl-3-methylimidazolium bis(perfluoroethylsulfonyl) imide, 1-ethyl-3-methylimidazolium tetrafluoroborate, 1-ethyl-3-methylimidazolium dicyanoamine, 1-methyl-1-propylpyrrolidinium bis(trifluoromethanesulfonyl)imide, 1-methyl-1-propylpyrrolidinium bis(fluorosulfonyl)imide, 1-methyl-1-propylpiperidinium bis(trifluoromethanesulfonyl)imide, trimethylbutylammonium bis(trifluoromethanesulfonyl)imide, and trimethylpentylammonium bis(trifluoromethanesulfonyl)imide." And further teaching "the ionic liquid is selected from: 1-ethyl-3-methylimidazolium bis (trifluoromethanesulfonyl)imide and 1-ethyl-3-methylimidazolium bis(fluorosulfonyl)imide. And further teaching "the ionic liquid is selected from: 1-ethyl-3-methylimidazolium bis(trifluoromethanesulfonyl)imide and 1-ethyl-3-methylimidazolium bis(fluorosulfonyl)imide."

The ionic liquid gel is comprised of ionic liquid, polymer, additives. In some embodiments, the ionic liquid gel is comprised of TEGDA and an ionic liquid like EMIM-TFSI. Before curing, these ingredients are miscible. However, as the ultraviolet curing resin TEGDA polymerizes, the ionic liquid and the curing polymer phase separate into regions with a high percentage of ionic liquid and a low percentage of polymer; and also separate into regions with a low percentage of ionic liquid and a high percentage of polymer or gel or rigid gel or solids.

Suitable ultraviolet resins, photoinitiators, and additives can be selected by a person having ordinary skill in the art.

Depending on the ratio of ionic liquid to resin and other factors such as surface energy and density, the ionic liquid can form isolated droplets within the resin matrix. This is called polymer dispersed morphology. In other embodiments the ionic liquid can form continuous channels within the resin matrix, so called polymer network morphology. In other embodiments with small amounts of polymer, the polymer preferentially adheres to the interface separating the ionic liquid and the electrodes, forming a textured interface, so called surface stabilized morphology.

The structure of the ionic liquid gel can be identified as a polymer network ionic liquid gel [57] or a polymer dispersed ionic liquid gel [58], or a polymer stabilized ionic liquid gel.[59]

In order to manufacture low cost dichalcogenide based transistors using printing equipment on commodity substrates, the coatings must be processed at temperatures below the glass transition temperatures of the substrates, and the substrates and the coated materials must have some stretch ability and bendability.

Ion-gels have some stretch ability and bendability. In [6] the authors here reported fabrication of stretchable thin film mos2 transistors using ion gels as gate dielectrics. The fabricated device exhibited stable operation at strains of up to 5%. The other materials comprising the device also have stretch ability: pedot/psst, carbon electrodes, and polyester film substrates.

In [29], the authors have reported electrostatic doping using an ionic-liquid (il) gate as a viable approach to achieve low resistance mos2/metal tunneling contacts. They reported significant improvement in the performance of few-layer MoS2 FETs and high carrier mobility in the MoS2 channel. They also reported a significant increase of the tunneling efficiency that could be attributed to strong band bending at the MoS2/metal interface, provided by the thin electrical double layer with a high capacitance.

Carrier density is a key parameter in determining the electronic phase in materials. In a transistor geometry, an electric field can be applied across the gate dielectric and modulate the density of mobile charges in the channel material. The traditionally used dielectrics such as SiO2 and HfO2 are air-stable, easy to handle, and readily compatible with device fabrication.

However, due to their low capacitance ($\sim 10$ nF/cm$^2$), the maximum charge density accessible is around $10^{12}$/cm$^2$, which is not high enough to induce electronic phase transitions in some materials [30].

The performance of MoS2 FETs can be optimized by using low resistance ohmic contacts. This can be done in two ways: (a) Schottky contacts with a very low barrier height and (b) highly transparent tunneling contacts.

Ideally, an Ohmic contact can be formed if the Schottky barrier height is zero (or negative).

In [29], the authors have reported electrostatic doping using an ionic-liquid (IL) gate as a viable approach to achieve low resistance MoS2/metal tunneling contacts. They reported significant improvement in the performance of few-layer MoS2 FETs and high carrier mobility in the MoS2 channel. They also reported a significant increase of the tunneling efficiency that could be attributed to strong band bending at the MoS2/metal interface, provided by the thin electrical double layer with a high capacitance.

Ionic liquids are binary organic salts that can form electric double layers at the ionic-liquid/solid interface and thus act as nano-gap capacitors with extremely large capacitance.

While ordinary liquids such as water and gasoline are predominantly made of electrically neutral molecules, ionic liquids are largely made of cation and anions and short-lived ion pairs. Similar substances are variously called liquid electrolytes, ionic melts, ionic fluids, fused salts, liquid salts, or ionic glasses. Ionic liquids are described as having many potential applications. They are powerful solvents and electrically conducting fluids. Sometimes ionic liquids are diluted with a solvent to provide suitable viscosities that do not compromise performance" [31]. Ionic liquids are known as green solvents that possess low toxicity and virtually no vapor pressure. They contain large asymmetric organic cations coupled with organic and inorganic anions [32]. Since they have no vapor pressure, they do not evaporate, and in this sense, they are considered to be green solvents [34]. An ionic liquid generally consists of a large cation and a smaller, inorganic anion. The asymmetry reduces the lattice energy of the crystalline structure and results in a low-melting-point salt. These simple liquid salts (single anion and cation) can be mixed with other salts (including inorganic salts) to form multicomponent ionic liquids. There are estimated to be hundreds of thousands of simple ion combinations to make ionic liquids and a near endless number of potential ionic liquid mixtures. This implies that it should be possible to design an ionic liquid with the desired properties to suit a particular application by selecting anions, cations, and mixture concentrations. Ionic liquids can be adjusted or tuned to provide a specific melting point, viscosity, density, hydrophobicity, etc. for specific chemical systems [35].

In some embodiments, the viscosity of the gate layer can change as the result of phase change or polymerization or ultraviolet curing or other processes. In some embodiments, the characteristics of the coating change dramatically from a relatively low viscosity fluid, and change to a gel, or a stiff gel, or a solid, changing from a liquid phase to a solid phase. Examples of viscosity changing materials are gelatins, gels, gums, hot melt glues, thermoplastic toner ingredients, fast polymerizing materials, ultraviolet curing resins, and other materials. Once the coating has assumed a semi-solid or solid phase, the orientation of the major axis of the dichalcogenide flake is fixed.

In some embodiments the gate layer includes ionic-liquids and includes thickeners chosen from the group comprising thixotropics, resins, foams, sol-gels, gels, gelatins, cellulosics, acrylamides, acrylates, polymers, rheology agents, inorganic thickeners, ultraviolet curing resins, and additives.

In some embodiments the coating changes from a liquid to a stiff gel or semi solid as a solvent or water evaporates from the coating. Examples of these coatings are gelatin, agar, gums, and various celluloses. While the coating is in a low viscosity phase, a charge is applied to the coating, or a second electrode in contact with the coating. Then a device gives a second electrode an electrical charge opposite to that of the second electrode. The dichalcogenide flakes are then are attracted to the second electrode. As the flakes transit to the second electrode coating, the flake is oriented with its major axis coincident with the electromagnetic field lines, which is generally normal to the coating on the second electrode. Once a portion of the flake is buried in the coating, the orientation of the flake is maintained by the interaction of the charge on the dichalcogenide flake, and the opposite charge of the coating electric field, again coincident with the electromagnetic field lines. As the solvent or water evaporates from the gate layer, the coating changes state to a stiffer gel, a semi-solid, or a solid phase. Once the coating has changed state to a semi solid or solid or stiff gel, the flake is permanently fixed in its orientation, and the electrical fields can be discontinued.

The flake shape of the dichalcogenide allows easy penetration through the dielectric coating and embedding the edge of the flake into the charge transfer layer and electrode layer.

In some embodiments, the coating changes phase relative to temperature. Examples of phase change coatings are hot melt glues and thermoplastic toner ingredients used in copiers and laser copiers. Exemplary hot melt glues are polyethylene and polyvinyl acetate. Exemplary toner ingredients are waxes.

In some embodiments, the coatings are deposited using equipment similar to photocopying machines, or laser copiers. In one embodiment, the photocopy machine toner is comprised of thermoplastic powder, dichalcogenide flakes, and other additives. After the drum has been selectively charged, the toner particles are selectively attracted to areas of the drum. Then the substrate is brought within close proximity to the drum. In some embodiments, the substrate has a charge opposite that of the drum. The toner is selectively attracted and deposed to the substrate. After deposition, a fuser heater raises the temperature of the toner above its melting temperature. After reaching the desired temperature, the lower viscosity of the toner allows the dichalcogenide flakes mixed within the toner to assume an orientation with its major axis normal to the substrate, to comply with the electric field lines. In some embodiments, immediately after reaching its melting temperature, the toner is subject to a much stronger electric field, causing the dichalcogenide flakes to orient its major axis normal to the substrate, to comply with the electric field lines. The orientation of the flakes is maintained until the toner temperature drops below its glass transition temperature. The interaction of the charge on the flake, and the opposite charge on the substrate, maintains the flake position. Once the toner coating drops below its melting temperature, the field applied to the substrate can be discontinued.

In other embodiments like photocopying, the photocopy machine deposits the first conductive electrode on to a substrate. Then the photocopy machine deposits a thermoplastic toner on to a first photocopy machine drum, and then ultimately selectively transfers the patterned thermoplastic toner to the substrate. Afterwards, the temperature of the toner is raised above its melting temperature, and the toner has a much lower viscosity. The photocopy machine then deposits the dichalcogenide flakes on to a second drum, and then ultimately on to the substrate, depositing the flakes buried in the thermoplastic toner coating. As the dichalcogenide flakes transit and are deposed into the thermoplastic toner coating on the substrate, a strong electrical field orients the flake as it transits from the drum to the thermoplastic coating, as it interacts with the opposite field applied to the substrate. The electric field orients the major axis of the flake normal to the substrate. Whilst the normal orientation of the major axis of the flake is maintained, after a predetermined time period the thermoplastic toner cools, and the flake is affixed in place. The field applied to the substrate is discontinued. Subsequently the photocopy machine prints a second electrode, and other additional functional coatings.

In some embodiments the major axis of each flake is oriented nonparallel with respect to the device. In some of these embodiments the plurality of flakes are disposed at the same angle. But in other embodiments, the major axis of the flakes varies from flake to flake, with orientation angles which differ from flake to flake.

Flakes which are oriented with their major axis oriented at an angle other than 90 degrees would likely absorb more light in some embodiments.

In some embodiments the gate layer is a mixture of ultraviolet curing resins. During exposure to ultraviolet light, the mixture of ultraviolet curing resins, change state, from a low viscosity fluid, to a gel, to a semi-rigid gel, or to a solid resin mixture. In some embodiments the coating is a mixture of ultraviolet curing resins and ionic liquid, sometimes called an ionic liquid gel. Exemplary components of ultraviolet curing resins are; photo initiators, additives, crosslinkers like TMPTA, and acrylates like TEGDA. In some embodiments, the dichalcogenide flakes are deposited using electrostatic processes and similar electromagnetic processes. During electrostatic deposition or electromagnetic deposition, the dichalcogenide flakes penetrate the mixture of ultraviolet curing resins and the flakes contact the conductive substrate underneath the resin. But after ultraviolet curing the ultraviolet curing resin mixture changes from a low viscosity fluid into a stiff gel or a solid. The solid state of the ultraviolet curing resin fixes the orientation of the major axis of the flake relative to the underlying first electrode or substrate. After curing, the flake is locked into intimate contact with the first electrode. In some embodiments, the barrier properties of the gate layer prevent oxidants, water, and contaminants from affecting the flake. In some embodiments, the gate layer resin functions as a mask, and inhibits the impurities or dopants from implanting to the dichalcogenide flakes and prevents the dopants from changing the character of the buried portion of the flakes.

The exposed upper portion of the flake can be coated or treated with impurities (dopants) which modify the characteristics of the upper portion of the flake. In some embodiments, dopants can modify the flake in many ways. In some embodiments the dopants modify the work function of the semiconducting flakes, or they can enable efficient charge transfer, or they can provide ohmic contact to the transistor electrodes, or they can change the magnetic properties of the flake, or they can permanently fix the orientation of the flake in the gate layer, or they can repair sulfur vacancies, or they can improve electrical conductivity, amongst other modifications.

In some embodiments the charge transfer layer or conformal second electrode surrounding the upper portion of the flake contain ligands which bind to the dichalcogenide flakes and thus optimize the contact of the flake with the second electrode. In other embodiments, the exposed end of the flake can be coated with ligands that enhance the ohmic connectivity between the flake and the top electrode. In some embodiments the top electrode is comprised of conductive carbon black, which is a durable and low-cost conductive ink. In other embodiments, PEDOT/PSST or polyaniline.

The ultraviolet curing ionic liquid gel cures at rates comparable to that of ordinary commercial UV curing resins. The ionic liquid gel adheres to the substrate comparable to that of ordinary commercial UV curing resins.

Due to the high mobility of the cations and anions, electrons and holes move quickly throughout the ionic liquid gel comprising the gate layer. Therefore, for basic commercial performance defined by mobility, there is wide latitude for the gate layer thickness and positioning.

In some embodiments, the dichalcogenide flake is deposited normal into the gate layer covering a first bottom source electrode or substrate, normal to the source electrode. Then a second top electrically conductive drain electrode is coated to contact the exposed end of the flake. Hence the flake is also normal to the second electrode, the top electrode. Therefore, electrical conduction occurs almost exclusively along the z axis of the device, along the major axis of the flakes, between the source electrode and the drain electrode, bridging across the gate layer, the channel length. Since conduction occurs along the z axis of the device, so called anisotropic conduction, its conduction is similar to the anisotropic electrical conduction of anisotropic conductive adhesive films and anisotropic adhesives. And printing registration of these electrodes is as facile as any anisotropic adhesive film or anisotropic adhesive. Since the conduction is anisotropic, the printing registration of the electrodes is well within the registration tolerances of most commercial web printing presses and sheetfed printing presses.

Printing Processes, Properties, to Depose Transistor Layers

The printing registration tolerance of a printing press is the relative deposing placement ranges between one deposed material and another deposed material on the same substrate. For example, with ordinary flexographic printing presses, the printing registration tolerance is estimated at plus or minus 0.0015 inches. In some of these embodiments, the registration of the transistor layers is twice the registration tolerance of the printing press, which for a flexographic printing press would be 0.003 inches.

Many ordinary flexographic printing presses, sometimes described as label printers, can faithfully reproduce 150 nanometer THICK gate layers with tolerances of plus or minus 50 nanometers. In some of our embodiments, the z axis conduction between the source electrode and drain electrode occurs along a gate length that is approximately 150 nanometers thick. In some embodiments this layer includes ionic liquids. In some embodiments the ionic liquid has an ionic conductivity of at least about 0.1 mS/cm, a carrier density of at least about $10^{12}/cm^2$-$10^{14}/cm^2$, and an electrochemical window of at least about 2 Volts. The gate length of about 150 nanometers, when coupled with the ionic conductivity, the carrier density, and the electrochemical window of the ionic liquid, enables high mobility and a relatively long channel length between the electrodes. And the anisotropic conduction enables facile printed registration of the source electrode relative to the drain electrode. The ionic conductivity, carrier density, and the electrochemical window of the ionic liquid also enables printing the gate electrode distant from the source electrode and the drain electrode, thus enabling facile printing registration. Ordinary commercial printing presses can easily print the transistor layers in register within 2 times the printing device's ordinary registration tolerance.

Examples of some ordinary commercial presses that are suitable for printing these novel embodiments are flexographic printing, gravure printing, tampon printing, intaglio printing, screen printing, inkjet printing, web printing, offset printing, silkscreen printing, and pad printing.

In one non-limiting embodiment, a transistor structure can be fabricated on a continuous web printing press with the following simplified steps:
  unwind the substrate
  clean the substrates
  print the pedot/psst source electrode and then dry the source electrode
  print the gate layer, ionic liquid gel or other gate material
  optionally charge the source electrode with an electrical charge, to attract the flakes in this following step
  deposit the dichalcogenide flakes using a CIJ station, or xerography station, or other deposition method
  cause the gate layer to change state to a higher viscosity, e.g. ultraviolet cure the ionic liquid gel gate layer
  optionally overprint the exposed flakes with a dopant an impurity or a ligand or other additive, or other doping method and then
  optionally dry the dopant coating, or ligand coating, or other additive coating
  print the top pedot/psst drain electrode using a print station, or an inkjet printhead station, and then dry the drain electrode
  print the pedot/psst gate electrode and then dry the gate electrode
  print the silicone coating or the pvdf coating or the Cytop coating to inhibit coulomb scattering and then dry the coating
  print the saran resin or other barrier resin and dry the barrier resin Pu et al. teach a channel length of 480 microns, using an ionic liquid gel on a flexible substrate, with a mobility of 3.01 cm2/Vs, and an on/off current ratio of 1000, and an operating voltage of less than 1V. [5] Kim et al. Teach a 100-micron gate length.[64]

Characteristics of Prior Art Mosfets

The MOSFET (Metal Oxide Semiconductor Field Effect Transistor) transistor, sometimes called a fet is a semiconductor device which is widely used for switching and amplifying electronic signals in the electronic devices. The MOSFET is a core of integrated circuits and it can be designed and fabricated in a single chip because of these very small sizes. The MOSFET is a four-terminal device with source(S), gate (G), drain (D) and optional body (B) terminals. The body of the MOSFET is frequently connected to the source terminal so making it essentially a three-terminal device like field effect transistor. The MOSFET is by far the most common transistor and can be used in both analog and digital circuits.

The MOSFET works by electronically varying the width of a channel along which charge carriers flow (electrons or holes). The charge carriers enter the channel at source and exit via the drain. The width of the channel is controlled by the voltage applied to the gate layer which is located between source and drain.

The MOSFET can function in two ways; Depletion Mode and Enhancement Mode.

In depletion mode, when there is no voltage on the gate, the channel shows its maximum conductance. As the voltage on the gate is either positive or negative, the channel conductivity decreases.

In enhancement mode, when there is no voltage on the gate the device does not conduct.

The higher the voltage on the gate, the better the device can conduct.

Working Principle of MOSFET:

The aim of the MOSFET is to be able to control the voltage and current flow between the source and drain. It works almost as a switch. The Function of the MOSFET depends upon the semiconductive material. The semiconductor layer is located between source and drain terminal. It can be inverted from p-type to n-type by applying a positive or negative gate voltage respectively. When we apply the positive gate voltage the holes present under the oxide layer are affected by a repulsive force and holes are pushed downward towards the substrate. The depletion region is populated by the bound negative charges which are associated with the acceptor atoms. The electrons migrate once the appropriate channel is formed. The positive voltage also attracts electrons from the n+ source and drain regions into the channel. Now, if a voltage is applied between the drain and source, the current flows freely between the source and drain and the gate voltage controls the electrons in the channel. Instead of positive voltage if we apply negative voltage, a hole channel will be formed under the oxide layer.

P-Channel MOSFET:

The P-Channel MOSFET has a P-Channel region between source and drain. It is a four terminal device containing gate, drain, source, body. The drain and source are heavily doped p+ region, while the body or substrate is n-type. The flow of current is based on positively charged holes. When we apply the negative gate voltage, the electrons present under the oxide layer are pushed downward into the substrate with a repulsive force. The depletion region is then populated by the bound positive charges which are associated with the donor atoms. The negative gate voltage also attracts holes from the p+ source and drain region into the channel region.

N-Channel MOSFET:

The N-Channel MOSFET has an N-channel region between source and drain. It is a four terminal device comprising a gate, drain, source, and body. This type of MOSFET requires the drain and source to create a heavily doped n+ region, while the substrate or body is P-type. The current flows due to the negatively charged electrons. When we apply the positive gate voltage the holes present under the oxide layer are pushed downward into the substrate with a repulsive force. The depletion region is populated by the bound negative charges which are associated with the acceptor atoms. The electrons reach the channel when it is formed. The positive voltage also attracts electrons from the n+ source and drain regions into the channel. Now, if a voltage is applied between the drain and source the current flows freely between the source and drain and the gate voltage controls the electrons in the channel. Instead of positive voltage if we apply negative voltage a hole channel will be formed under the oxide layer. In general, any MOSFET is seen to exhibit three operating regions viz., Cut-off region, ohmic region, or saturation region:

Cut-off region is a region in which the MOSFET will be OFF as there will be no current flow through it. In this region, MOSFET behaves like an open switch and is thus used when they are required to function as electronic switches.

Ohmic or Linear Region

Ohmic or linear region is a region where in the current with an increase in the value of VDS. When MOSFETs are made to operate in this region, they can be used as amplifiers.

Saturation Region

In saturation region, the MOSFETs have their IDS constant despite an increase in VDS and saturation occurs when VDS exceeds the value of pinch-off voltage VP. Under this condition, the device will act like a closed switch through which a saturated value of IDS flows. As a result, this operating region is chosen whenever MOSFETs are required to perform switching operations.

n-Channel Enhancement-Type MOSFET

Due to the n-channel of this MOSFET, the transfer characteristics (drain-to-source current IDS versus gate-to-source voltage VGS), the current through the device will be zero until the VGS exceeds the value of threshold voltage VT. This is because under this state, the device will be void of channel which will be connecting the drain and the source terminals. Under this condition, even an increase in VDS will result in no current flow as indicated by the corresponding output characteristics (IDS versus VDS) s. As a result, this state represents nothing but the cut-off region of MOSFET's operation.

Next, once VGS crosses VT, the current through the device increases with an increase in IDS initially (Ohmic region) and then become saturated to a value as determined by the VGS (saturation region of operation) i.e. as VGS increases, even the saturation current flowing through the device also increases.

p-Channel Enhancement-Type MOSFET

Due to the p-channel of this MOSET, the transfer characteristics of IDS remains zero (cutoff state) until VGS becomes equal to −VT. This is because, only then the channel will be formed to connect the drain terminal of the device with its source terminal. After this, the IDS is seen to increase in reverse direction (meaning an increase in ISD, signifying an increase in the device current which will flow from source to drain) with the decrease in the value of VDS. This means that the device is functioning in its ohmic region wherein the current through the device increases with an increase in the applied voltage (which will be VSD).

However, as VDS becomes equal to −VP, the device enters into saturation during which a saturated amount of current (IDSS) flows through the device, as decided by the value of VGS. Further it is to be noted that the value of saturation current flowing through the device is seen to increase as the VGS becomes more and more negative i.e. saturation current for VGS3 is greater than that for VGS2 and that in the case of VGS4 is much greater than both of them as VGS3 is more negative than VGS2 while VGS4 is much more negative when compared to either of them. In addition, from the locus of the pinch-off voltage it is also clear that as VGS becomes more and more negative, even the negativity of VP also increases.

n-Channel Depletion-Type MOSFET

The transfer characteristics of the n-channel depletion MOSFET dictate that the device has a current flowing through it even when VGS is 0V. This indicates that these devices conduct even when the gate terminal is left unbiased, which is further emphasized by the VGS0 curve. Under this condition, the current through the MOSFET is seen to increase with an increase in the value of VDS (Ohmic region) until VDS becomes equal to pinch-off voltage VP. After this, IDS will get saturated to a particular level of IDSS (saturation region of operation) which increases with an increase in VGS i.e. IDSS3>IDSS2>IDSS1, as VGS3>VGS2>VGS1. Further, the locus of the pinch-off voltage also shows that VP increases with an increase in VGS.

However it is to be noted that, if one needs to operate these devices in cut-off state, then it is required to make VGS negative and once it becomes equal to −VT, the conduction through the device stops (IDS=0) as it gets deprived of its n-type channel.

p-Channel Depletion-Type MOSFET

The transfer characteristics of p-channel depletion mode MOSFETs show that these devices will be normally ON, and thus conduct even in the absence of VGS. This is because they are characterized by the presence of a channel in their default state due to which they have non-zero IDS for VGS=0V, as indicated by the VGS0 curve. Although the value of such a current increase with an increase in VDS initially (ohmic region of operation), it is seen to saturate once the VDS exceeds VP (saturation region of operation). The value of this saturation current is determined by the VGS and is seen to increase in negative direction as VGS becomes more and more negative. For example, the saturation current for VGS3 is greater than that for VGS2 which is however greater when compared to that for VGS1. This is because VGS2 is more negative when compared to VGS1, and VGS3 is much more negative when compared to either of them. Next, one can also note from the locus of pinch-off point that as VP starts to become more and more negative as the negativity associated with the VGS increases. Lastly, in order to switch these devices OFF, one needs to increase VGS such that it becomes equal to or greater than that of the threshold voltage VT. This is because, when done so, these devices will be deprived of their p-type channel, which further drives the MOSFETs into their cut-off region of operation.

Semiconductors and Dielectrics

Solid-state materials are commonly grouped into three classes: insulators, semiconductors, and conductors. (At low temperatures some conductors, semiconductors, and insulators may become superconductors) c. Insulators such as fused quartz and glass, have very low conductivities, on the order of $10^{18th}$ to $10^{10th}$ siemens per centimeter; and conductors have high conductivities, typically from $10^4$ to $10^6$ siemens per centimeter. The conductivities of semiconductors are between these extremes and are generally sensitive to temperature, illumination, magnetic fields, and minute amounts of impurity dopant atoms. For example, the addition of about 10 atoms of boron per million atoms of silicon can increase its electrical conductivity a thousand-fold.

Intrinsic Semiconductor

In the classic crystalline semiconductors, electrons can have energies only within certain bands (ranges of energy levels). The energy of these bands is between the energy of the ground state and the free electron energy (the energy required for an electron to escape entirely from the material). The energy bands correspond to many discrete quantum states of the electrons. Most of the states with low energy (closer to the nucleus) are occupied, up to a particular band called the valence band.

Semiconductors and insulators are distinguished from metals by the population of electrons in each band. The valence band in any given metal is nearly filled with electrons under usual conditions. In semiconductors, only a few electrons exist in the conduction band just above the valence band, and an insulator has almost no free electrons.

Semiconductors and insulators are further distinguished by the relative band gap. In semiconductors, the band gap is small, allowing electrons to populate the conduction band. In insulators, it is large, making it difficult for electrons to flow through the conduction band.

Extrinsic Semiconductor

The name "extrinsic semiconductor" can be a bit misleading. While insulating materials may be doped to become semiconductors, intrinsic semiconductors can also be doped, resulting in an extrinsic semiconductor. There are two types of extrinsic semiconductors that result from doping: atoms that have an extra electron (n-type for negative, from group V, such as phosphorus) and atoms that have one fewer electron (p-type for positive, from group III, such as boron).

In semiconductor production, doping intentionally introduces impurities into an extremely pure, or intrinsic, semiconductor for the purpose of changing its electrical properties.

The impurities depend on the type of semiconductor. Lightly and moderately doped semiconductors are referred to as extrinsic. When a semiconductor is doped to such a high level that it acts more like a conductor than a semiconductor, it is referred to as degenerate.

N-type semiconductors are a type of extrinsic semiconductor in which the impurity atoms are capable of providing extra conduction electrons to the host material (e.g. phosphorus in silicon). This creates an excess of negative (n-type) electron charge carriers.

Impurity Dopant atoms and molecules usually have one more valence electron than the host atoms. The most common example is atomic substitution in group-IV solids by group-V elements. The extra valence atoms provided by the impurity or dopant allow the semiconductor to function as an N type semiconductor. III-V semiconductors such as gallium arsenide and silicon can function as donors when they substitute for gallium or acceptors when replacing arsenic. Some donors have fewer valence electrons than the host, such as alkali metals, which are donors in most solids.

A p-type (p for "positive") semiconductor is created by adding a certain type of atom to the semiconductor in order to increase the number of free charge carriers. When the doping material is added, it takes away (accepts) weakly bound outer electrons from the semiconductor atoms. This type of doping agent is also known as an acceptor material, and the vacancy left behind by the electron is known as a hole. The purpose of p-type doping is to create an abundance of holes.

In the case of silicon, a trivalent atom is substituted into the crystal lattice. The result is that one electron is missing from one of the four covalent bonds normally part of the silicon lattice. Therefore, the impurity atom can accept an electron from a neighboring atom's covalent bond to complete the fourth bond, this promotes effective charge transfer through p type doping. When the impurity atom accepts an electron, this causes the loss of one paired electron from the neighboring atom, resulting in the formation of a hole. Each hole is associated with a nearby negatively charged dopant ion, and the semiconductor remains electrically neutral overall. However, once each hole has wandered away into the lattice, one proton in the atom at the hole's location will be "exposed" and no longer cancelled by an electron. This atom will have three electrons and one hole surrounding the nucleus with four protons. For this reason, a hole behaves as a positive charge. When a sufficiently large number of acceptor atoms are added, the holes greatly outnumber thermally excited electrons. Thus, holes are the majority carriers, while electrons become minority carriers in p-type materials.

Edge Contact, Ohmic Contact

Mos2 is strongly affected responsive by electromagnetic fields. And the mos2 flake has its strongest electromagnetic response, along the major axis of the flake, which is synonymous with the longest axis of the flake.

During these electromagnetic deposition processes, an electrical charge is applied to the MoS2 flake. The charge can be positive or negative. After an electrical charge is applied to the MoS2 flake, the flake is brought into proximity to a substrate or electrode of the opposite electrical charge, causing the flake to be attracted to the oppositely charged substrate or electrode.

Since the greatest charge polarity is along the major axis of the flake, the flake is planted with its major axis normal to the electrode or substrate. The edge of the flake contacts the charge transfer layer or the electrode layer.

In some embodiments the electrode or substrate with the opposite charge is coated with a gate layer, or other layers. The edge of the flake penetrates the gate layer, and contacts the source electrode, the bottom electrode. The charged flake remains oriented normal to the electrode with the opposite charge. In some embodiments the gate layer is comprised of an ultraviolet radiation curing resin. After the flake is planted in the ultraviolet curing resin, the resin is cured, and the flake is permanently oriented normal to the electrode. One portion of the flake remains buried in the resin, while the remainder of the flake protrudes from the surface of the gate layer.

FIG. 3 illustrates a specific, generic, but non-limiting example of an ohmic interaction between the valence domains of a molybdenum disulfide molecule and the valence electrons of a charge transfer molecule, a polythiophene molecule. The orthogonal p electrons from the pi bonds in the thiophene ring donate electron density binding the Molybdenum atom comprising the Dichalcogenide Flake. This type of interaction is known as a dative bond or coordinate covalent bond. The thiophene acts as a pi electron donor ligand. Other examples of bonds, such as ionic bonds, polar covalent bonds, and others can also form ohmic interactions. The Dichalcogenide Flake has available valencies that associate with the valence electrons of adjacent charge transfer molecules, said association being ohmic interaction.

In some embodiments the oppositely charged electrode is a relatively soft durometer conductive polythiophene. In some cases, the flake is attracted with such strong force that the flake pierces into the surface of the conductive polythiophene electrode. In some embodiments, the Molybdenum atoms have surface sulfur vacancies in which the molybdenum is exposed and able to form coordinate bonds with molecules like polythiophene, which have available pi electrons due to conjugation and/or ring delocalization. The contact formed between the flake and the electrode is edge contact, an ohmic contact.

Continuous Biphasic Flake, a Heterojunction

In some embodiments, as the mixture of dichalcogenide flakes and solvent transit, the solvent evaporates as the motion of the flake continues. It is attracted to the oppositely charged substrate or electrode, and buries a portion itself into the gate layer, with its major axis having an orientation normal to the substrate or electrode. If the flake has a major axis longer than the thickness of the gate layer, then the opposite end of the flake remains protruding from the surface of the gate layer. In some embodiments the protruding portion of the flake is modified with dopants or impurities which change the characteristics of the flake, generally changing the work function of the protruding portion. In some embodiments the gate layer functions as a mask or barrier preventing the impurities from penetrating into the gate layer and contaminating the portion of the flake buried in the gate layer. In some embodiments the protruding portion of the flake is doped with atoms like Oxygen, Nitrogen, Rhenium, Niobium, Zinc, Tungsten, Molybdenum, Iron, Chromium, Manganese, Vanadium, Selenium, Sulfur, Tellurium, Phosphorus, Potassium, Hydrogen, and Chlorine. In these embodiments the flake is described as bi-phasic. In these embodiments the portion of the flake which is buried in the gate layer retains the original characteristics of the flake, while the portion of the flake protruding from gate layer is changed by the impurities. After doping, the flake has two phases, that is, it is a heterojunction. But since the dichalcogenide is a single continuous flake, it is a heterojunction with little or no contact resistance between the n type portion of the flake and the p type portion of the flake.

It is known that edge contact between the edge of the MoS2 flake and its electrode has greater ohmic efficiency than the contact between the bulk surface of the MoS2 flake and an adjacent electrode. As a result of processes like electrostatic deposition, the flake is deposited normal to the oppositely charged electrode, depositing the thin edge of the flake immediately adjacent to the electrode, enabling high ohmic efficiency edge contact. The authors of [141] teach that "In the case of edge contact, stronger orbital overlap was observed at the metal/2D material interface, and a lower tunneling barrier was obtained compared to the top contact.

In some embodiments the Molybdenum Disulfide has some Molybdenum atoms which have available valence domains. These valence domains can associate with the available electrons of adjacent atoms which comprise the charge transfer molecules. This association between the Molybdenum valence domains and the available electrons which comprise the charge transfer molecules is ohmic in character.

As we were making our first prototypes of edge contact transistors and diodes, we were surprised by our quick success and the ohmic character of the devices. We were also surprised by the facile assembly of the prototype, in contrast to the difficult and cumbersome vertical stacking methods taught by the scientific literature.

In general, an electrode comprised of pedot/psst (polythiophene/polystyrene sulfonate) has a low durometer the much harder dichalcogenide flake which is oriented with its major axis normal to the pedot/psst electrode, can easily embed its thin leading edge into the coating. Likewise, a PEDOT/PSST coating can form a conformal cap on the top of the dichalcogenide flake or surround the flake to achieve a good electrical contact.

"Various doping techniques have recently been studied to improve the electrical and optical properties of 2D materials; these techniques include i) surface charge transfer doping, ii) interfacial dipole formation doping, iii) substitutional doping, and iv) fixed charge layer doping." [60]

"This effect suggests a one-step p-n junction fabrication method on a single sheet of InSe with the Ti-coordinated half serving as the anode and the pristine half serving as the cathode. This represents a great advantage of our method that distinguishes it from other p-n junction fabrication methods that involve delicate alignment or well-controlled growth process6. More importantly, a simple lithography process can be used to build entire integrated circuits on a single piece of 2D material".[61]

"Surface charge transfer doping techniques were achieved by spin-coating (BV, DDQ, AuCl3, and F4TCNQ), drop-casting (NADH, TCNQ, and F4TCNQ), gas flow (K, and NO2), deposition (Cs2CO3, and MoO3) on the 2D material samples, or immersion (AuCl3, and PPh3) of the samples in solution. In particular, MoS2 and WSe2 were doped to the degenerate level using BV, AuCl3, K, and NO2. Fang reported high performance MoS2- and WSe2-based FETs with high field-effect mobility by degenerately doping the source/drain (S/D) regions with K and NO2 molecules." [62]

"Phase patterning has largely been used to lower the contact resistance of TMDC devices, by inducing the formation of the metallic 1T phase beneath metal contacts.53, 55,58 For example. The contact resistance was lowered from 1.1 k??m for 2H contacts to ~0.2 km for 1T contacts using this technique Inducing an ohmic contact between 2H1T TMDCs also can increase FET device mobility and reduce subthreshold swing while maintaining a high on/off ratio. The immense benefits of phase engineering on FET device performance warrants the inclusion of this processing technique when fabricating high-performance devices." [63]

When two semiconductors with opposite carrier type contact one another, charge transfer occurs across their interface and creates a potential difference determined by the doping profile. In bulk semiconductor p-n junctions, the doping level is primarily controlled via diffusion or implantation of substitutional impurities or electrostatic doping. The atomically thin structure of these materials enables doping modulation of the TMDC flake.

However, as the dimension of these materials are reduced, the edge effects become very prominent, leading to change in their structure as well as properties. According to theoretical studies [4], mos2 with zig zag edges undergo semiconducting to metallic and non-magnetic to ferromagnetic transitions accompanied with the dimension reduction from 2d to 1d. Besides, tuning the magnetic and electronic properties, edge effects also leads to change in the catalytic performance of mos2. Sometimes vacancies occur in the mos2 flake edges and the basal planes of the mos2 flake. These vacancies are binding sites for novel functionalizing ligands to bind with the mos2.

In some embodiments, the dichalcogenide flakes have available valence domains associating with the available electrons of adjacent impurities. In some embodiments, these impurity electrons adjacent to the dichalcogenide flakes valence domains associate with the valence domains and change the work function of that portion of the dichalcogenide flake where these impurities are implanted.

Higher carrier density and lower operation voltage are essential to the functioning of field-effect transistors (FETs). However, this is a great challenge in conventional FETs owing to the low capacitance and electric breakdown of gate dielectrics. Recently, electric double-layer technology with ultra-high charge-carrier accumulation at the semiconductor channel/electrolyte interface has been creatively introduced into transistors to overcome this problem. Some interesting electrical transport characteristics such as superconductivity, metal-insulator transition, and tunable thermoelectric behavior have been modulated both theoretically and experimentally in electric double-layer transistors (EDLTs) with various semiconductor channel layers and electrolyte materials. [38]

Transparent Transistors

Currently scientific writers define that a monolayer of MoS2 is a single triad of a layer of molybdenum in a lattice of sulfurs. Few layer MoS2 is 2-4 triads. Many layers is 4-8 MoS2 triads. And bulk MoS2 is more than 8 triads, generally thicker than 100 nanometers, and is not transparent to visible light. In some embodiments, the dichalcogenide particles are flake shape and have an edge thickness measuring less than 100 nanometers, between 0.5 nanometers and 100 nanometers.

Monolayer and few layer MoS2 flakes are transparent in the visible. More than few layers and many layer MoS2 flakes are transparent to semitransparent.

Polythiophene/PSST electrodes are often transparent in the visible. Likewise, the UV curing resins or other materials comprising the gate layer betwixt the transistor electrodes are usually transparent, or semi-transparent. Therefore, the transistor structure is mostly transparent, given that the transistor ingredients are mostly transparent.

When used as transparent FETs for LCD displays or LED displays, very little light emitted by the display light generating devices is absorbed by the FETs, so light emission from the display backlight can be reduced. Since the light emission from the display light generating devices is reduced, the displays consume less electricity (and operate on batteries for a longer duration). In some prior art flat panel displays, the actual display pixel aperture is less than 65%. In some of these novel embodiments, transparent transistors will enable displays with pixel apertures exceeding 80%.

We claim:

1. A transistor comprising a substrate, a gate electrode contacted a gate layer, said gate electrode has a top surface approximately parallel to a top surface of said gate layer, a source electrode contacted said gate layer and has top and bottom surfaces approximately parallel to the top surface of said gate layer, a drain electrode contacted said gate layer and has top and bottom surfaces approximately parallel to the top surface of said gate layer, said gate layer which includes ionic liquid, thickener, and carriers, said ionic liquid having an ionic conductivity of at least about 0.1 microSiemens per centimeter, a carrier density of at least about $10^{12}/cm^2$-$10^{14}/cm^2$ and an electrochemical window of at least about 2 Volts, wherein said gate layer has a portion being sandwiched within a gap between said source electrode and said drain electrode, wherein said gate layer fills the gap between said source electrode and said drain electrode, and bridges said gap between said source electrode and said drain electrode, wherein said gate layer includes a plurality of semiconducting dichalcogenide particles, wherein some of said particles contacted said source electrode, others contacted said drain electrode, and wherein said particles bridge the gap between said source electrode and said drain electrode, wherein portions of said particles are buried in said gate layer, and other portions of said particles protrude from a top surface of said gate layer, and wherein a major axis of each said particle is oriented in a direction normal to a top surface of said substrate, and wherein the major axis of each said particle is oriented in a direction normal to the top surface of said source electrode, and wherein the major axis of each said particle is oriented in a direction normal to the top surface of said drain electrode.

2. The transistor of claim 1, wherein said particles are flake shape and have an edge thickness between 0.5 nanometers and 100 nanometers.

3. The transistor of claim 1, wherein said transistor is a field effect transistor.

4. The transistor of claim 1, wherein said dichalcogenide is molybdenum disulfide.

5. The transistor of claim 1, wherein said gate layer includes said ionic liquid and said gate layer includes said thickeners chosen from the group comprising thixotropics, resins, foams, sol-gels, gels, gelatins, cellulosics, celluloses, acrylamides, acrylates, polymers, rheology agents, inorganic thickeners, ultraviolet curing resins, and additives.

6. The transistor of claim 1, wherein a cation constituting the ionic liquid is selected from imidazolium cations, pyrrolidinium cations, piperidinium cations, ammonium cations, and pyrazolium cations.

7. The transistor of claim 1, wherein the ionic liquid is constituted with a cation selected from 1-methyl-3-methylimidazolium, 1-ethyl-3-methylimidazolium, 1-propyl-3-methylimidazolium, 1-butyl-3-methylimidazolium, 1-pentyl-3-methylimidazolium, 1-hexyl-3-methylimidazolium, 1-octyl-3-methylimidazolium, 1,2-dimethyl-3-propylimidazolium, 1-methyl-1-propylpyrrolidinium, 1-methyl-1-butylpyrrolidinium, 1-butyl-1-methylpyrrolidinium, 1-methyl-1-propylpiperidinium, trimethyl propyl ammonium, trimethyl octyl ammonium, trimethyl hexyl ammonium, trimethyl pentyl ammonium, and trimethyl butyl ammonium, 1-ethyl-2,3,5-trimethylpyrazolium, 1-butyl-2,3,5-trimethylpyrazolium and 1-propyl-2,3,5-trimethylpyrazolium; and an anion selected from bis(trifluoromethanesulfonyl)imide, bis(fluorosulfonyl)imide, bis(perfluoroethylsulfonyl)imide, tetrafluoroborate, hexafluorophosphate, and dicyanoamine.

8. The transistor of claim 1, wherein the ionic liquid is selected from 1-ethyl-3-methylimidazolium bis(trifluoromethanesulfonyl)imide, 1-ethyl-3-methylimidazolium bis(fluorosulfonyl)imide, 1-ethyl-3-methylimidazolium bis(perfluoroethylsulfonyl)imide, 1-ethyl-3-methylimidazolium tetrafluoroborate, 1-ethyl-3-methylimidazolium dicyanoamine, 1-methyl-1-propylpyrrolidinium bis(trifluoromethanesulfonyl)imide, 1-methyl-1-propylpyrrolidinium bis(fluorosulfonyl)imide, 1-methyl-1-propylpiperidinium bis(trifluoromethanesulfonyl)imide, trimethylbutylammonium bis(trifluoromethanesulfonyl)imide, and trimethylpentylammonium bis(trifluoromethanesulfonyl)imide.

9. The transistor of claim 1, wherein impurities are implanted to said portions of said particles which protrude from said gate layer, said method of implanting impurities changing the characteristics of said portions of said particles which protrude from said gate layer, said method comprising the steps of:
   a) Deposing a layer comprising the ionic liquid, thickener, and carriers,
   b) Deposing said particles into said layer, wherein portions of said particles are buried in said layer, and other portions of said particles protrude from said layer,
   c) Polymerizing said layer to create the layer comprising said particles with portions protruding from said gate layer,
   d) Said layer being an impenetrable mask to said impurities,
   e) Selectively implanting said impurities to said protruding portions of said particles, and
   f) Said implanting changing the work function of said protruding portions of said particles.

10. The transistor of claim 1, wherein said layer being a barrier having a characteristic of preventing a transmission of water and oxygen.

11. The transistor of claim 1, wherein said particles have portions doped with impurities, and particles comprising available valence domains associate with available electrons of adjacent impurities changing work functions of the portions of the particles with the available valence domain.

12. The transistor of claim 1, with available electrons of adjacent charge transfer molecules, leading to electrical conductivity of at least about $1 \times 10^6$ Siemens per meter between said valence domains and said available electrons.

13. The transistor of claim 1, wherein said source electrode and said drain electrode are separated by said layer, said layer having a characteristic of modulating the density of said carriers and a speed of said carriers, said layer of said transistor is deposed by printing equipment chosen from the group comprising flexographic printing equipment, gravure printing equipment, tampon printing equipment, intaglio printing equipment, screen printing equipment, inkjet printing equipment, web printing equipment, offset printing equipment, silkscreen printing equipment, and pad printing equipment, said character of modulating resulting from the carrier density of said ionic liquid, and said character of modulating resulting from the ionic conductivity of said ionic liquid, and said character of modulating resulting from the electrochemical window of said ionic liquid.

14. The transistor of claim 1, wherein said gate electrode is deposed using printing equipment chosen from the group comprising flexographic printing equipment, gravure printing equipment, tampon printing equipment, intaglio printing equipment, screen printing equipment, inkjet printing equipment, web printing equipment, offset printing equipment, silkscreen printing equipment, and pad printing equipment, said deposing defined within two times the registration tolerance of said printing equipment employed in defining the location of the gate electrode, said two times the registration tolerance resulting from the carrier density of said ionic liquid, and said two times the registration tolerance resulting from the ionic conductivity of said ionic liquid, and said two times the registration tolerance resulting from the electrochemical window of said ionic liquid.

15. The transistor of claim 1, wherein said transistor being transparent.

16. The transistor of claim 1, wherein said transistor being semi-transparent.

17. The transistor of claim 1, wherein said transistor being flexible.

18. The transistor of claim 1, wherein said particles are deposed into said layer and said deposited particles bridge said gap between said source electrode and said drain electrode, said deposition processes chosen from the group comprising continuous inkjet printing, xerography, electrophotography, photocopying, laser printing, electrophotography, electrophoresis, pressure less printing, corona poling, electrostatic spraying, and flocking.

\* \* \* \* \*